US012302606B2

(12) United States Patent
Gardner et al.

(10) Patent No.: US 12,302,606 B2
(45) Date of Patent: May 13, 2025

(54) SEMICONDUCTOR DEVICES WITH CRYSTALLIZED CHANNEL REGIONS AND METHODS OF MANUFACTURING THEREOF

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 466 days.

(21) Appl. No.: 17/671,341

(22) Filed: Feb. 14, 2022

(65) Prior Publication Data

US 2023/0261075 A1 Aug. 17, 2023

(51) Int. Cl.
H10D 30/67 (2025.01)
H10D 30/01 (2025.01)
H10D 84/85 (2025.01)

(52) U.S. Cl.
CPC ....... *H10D 30/6735* (2025.01); *H10D 30/031* (2025.01); *H10D 30/6713* (2025.01); *H10D 30/6757* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 9,508,829 B1* | 11/2016 | Cheng | H10D 30/014 |
| 9,881,998 B1* | 1/2018 | Cheng | H01L 21/02192 |
| 10,504,900 B2* | 12/2019 | Hashemi | H10B 63/34 |
| 10,553,679 B2* | 2/2020 | Zhang | H10D 30/031 |
| 10,886,369 B2* | 1/2021 | Zhang | H01L 29/78684 |
| 11,069,681 B2* | 7/2021 | Shin | H01L 29/66439 |
| 2014/0014904 A1* | 1/2014 | Cohen | H01L 29/413 977/734 |
| 2015/0270340 A1* | 9/2015 | Frank | B82Y 10/00 438/151 |
| 2016/0020305 A1* | 1/2016 | Obradovic | H01L 21/8252 438/157 |
| 2018/0138291 A1* | 5/2018 | Smith | H10D 62/151 |
| 2019/0319095 A1* | 10/2019 | Zhang | H10D 88/01 |
| 2020/0294866 A1* | 9/2020 | Cheng | H10D 64/017 |
| 2021/0118879 A1* | 4/2021 | Gardner | H01L 25/0657 |
| 2021/0184000 A1* | 6/2021 | Ramaswamy | H01L 29/0673 |
| 2022/0102495 A1* | 3/2022 | Maxey | H01L 29/78681 |
| 2022/0199783 A1* | 6/2022 | Penumatcha | H10D 84/038 |
| 2022/0199797 A1* | 6/2022 | Naskar | H01L 29/78696 |
| 2022/0199838 A1* | 6/2022 | Dorow | H01L 29/517 |
| 2023/0099814 A1* | 3/2023 | Maxey | H01L 21/443 257/29 |

* cited by examiner

Primary Examiner — Nishath Yasmeen
(74) Attorney, Agent, or Firm — Foley & Lardner LLP

(57) ABSTRACT

Example implementations can include a semiconductor device with a first seed layer including a first material and having a planar structure, the first material having a two-dimensional structure, a first device layer including a second material and disposed over a first surface of the first seed layer, the second material having a crystallized structure, and a second device layer including the second material and disposed over a second surface of the first seed layer opposite to the first surface of the first seed layer.

12 Claims, 27 Drawing Sheets

Form First Metallic Source and Drain Electrode Layers on Sidewalls  2510

Partially Indent by Etching Disposable Stack Layers to Remove Edge Portions  2512

Fill Edge Portions with NMOS Metal  2514

Form Contacting First Source and Drain Layers  2516

Form Second Metallic Source and Drain Electrode Layers on Sidewalls  2520

Partially Indent by Etching Disposable Stack Layers to Remove Edge Portions  2522

Fill Edge Portions with PMOS Metal  2524

Form Contacting Second Source and Drain Layers  2526

Fig. 25

SEMICONDUCTOR DEVICES WITH CRYSTALLIZED CHANNEL REGIONS AND METHODS OF MANUFACTURING THEREOF

TECHNICAL FIELD

The present implementations relate generally to semiconductor devices, and more particularly to semiconductor devices with crystallized channel regions.

BACKGROUND

Semiconductor devices are increasingly desired to provide higher computational throughput. As performance requirements for semiconductor devices increase, semiconductor devices are increasingly expected to accommodate computation that matches accordingly. Manufacturing processes are correspondingly desired to result in semiconductor devices that can be created with a wider array of materials, due to the decreasing availability of many raw materials required for semiconductor production. Conventional devices cannot efficiently and effectively meet performance requirements in view of materials supply constraints. Improved fabrication processes and fabricated devices that can accommodate a wider array of materials while maintaining high device performance is thus desired.

SUMMARY

Present implementations are directed to semiconductor devices with enhanced performance characteristics that can be fabricated with a wider array of materials. Semiconductor devices in accordance with present implementations include two-dimensional (2D) materials that may allow transistor devices to improve performance over, for example, silicon devices fabricated by epitaxially-grown silicon. Present implementations can achieve these advantages by, for example, fabricating a three-dimensional stack utilizing a 360 degree gate-all-around (GAA) process. As one example, a deposited GAA 2D film can be crystallized or recrystallized to enhance the 2D material of the device. This technique advantageously enables a wider range of 2D materials to be utilized for fabricating a semiconductor device in a three-dimensional nanosheet stack including a channel region having a 2D material. Present implementations can include re-crystallizing with one step for the stack scaling of devices utilizing a GAA capping layer and having arbitrary stack height. Thus, a technological solution for semiconductor devices with crystallized channel regions is provided.

In one embodiment, a semiconductor device comprises a first metal contact; a second metal contact; a seed layer extending from the first metal contact to the second metal contact; a re-crystallized two-dimensional (2D) material around at least the first seed layer; and a gate structure around the re-crystallized 2D material.

The device may further include a first terminal layer in contact with a first end of the first seed layer, including a first terminal material and having the planar structure, the first metal contact comprising the first terminal layer; and a second terminal layer in contact with a second end of the first seed layer and opposite to the first terminal layer, including the first terminal material and having the planar structure, the second metal contact. The first seed layer, the first two-dimensional material, the first terminal layer, or the second terminal layer may comprise an NMOS material.

In another embodiment, a CFET semiconductor device may comprise a first seed layer including a first material having a planar structure, the first material having a two-dimensional structure and one of a PMOS or NMOS property; a first re-crystallized material around the first seed layer; a second seed layer including a second material having the planar structure, the first material having the two-dimensional structure and one of a PMOS or NMOS property different from the PMOS or NMOS property of the first seed layer; and a second re-crystallized material around the second seed layer.

The first re-crystallized material may be an NMOS material and the second re-crystallized material is a PMOS material. The device may further include a first metal and a second metal in contact with ends of the first seed layer; and a third metal and a fourth metal in contact with ends of the second seed layer.

The device may further include a third seed layer including the first material and having the planar structure; a third re-crystallized material around the third seed layer; a fourth seed layer including a second material and having the planar structure; and a fourth re-crystallized material around the fourth seed layer. The first metal and the second metal may be in contact with the third seed layer, and the third metal and the fourth metal may be in contact with the fourth seed layer. The first seed layer and the third seed layer may comprise a PMOS material. The second seed layer and the fourth seed layer may comprise an NMOS material.

In yet another embodiment, a method of manufacturing a semiconductor device may comprise forming a seed layer over a disposable stack layer, the seed layer having a two-dimensional (2D) structure and extending from a first metal contact to a second metal contact; forming a 2D material around the seed layer; forming a cap layer around the 2D material; re-crystallizing the 2D material with the first cap layer present; and removing the cap layer after re-crystallizing the 2D material.

The method may further comprise forming a dielectric layer over a substrate; forming the disposable stack layer over the dielectric layer; forming a second disposable stack layer over the 2D material; forming a second seed layer over a second disposable stack layer, the second seed layer having the 2D structure; and forming a third disposable stack layer over the second seed layer.

The method may further comprise removing the disposable stack layer, the second disposable stack layer, and the third disposable stack layer after forming the seed layer and the second seed layer and before re-crystallizing the 2D material. The method may further comprise forming a second dielectric layer over the third disposable stack layer.

The method may further comprise forming a first source layer and a first drain layer adjacent to the seed layer; and forming a second source layer and a second drain layer adjacent to the second seed layer. The first source layer, first drain layer, the second source layer, and the second drain layer may comprise an NMOS material. The first source layer and the first drain layer may comprise an NMOS material, and the second source layer and the second drain layer may comprise a PMOS material.

The method may further comprise forming a plurality of high-K dielectric layers on the re-crystallized 2D material, the high-K dielectric layers including a high-K dielectric material.

The seed layer and the second seed layer may comprise an NMOS material. The seed layer may comprise an NMOS material, and the second seed layer may comprise a PMOS material.

BRIEF DESCRIPTION OF THE DRAWINGS

These and other aspects and features of the present implementations will become apparent to those ordinarily skilled in the art upon review of the following description of specific implementations in conjunction with the accompanying figures, wherein:

FIG. 25 illustrates a method of manufacturing a second semiconductor device further to the method of FIG. 24, according to an embodiment.

DETAILED DESCRIPTION

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Present implementations are directed to manufacturing semiconductor devices having multiple advantages properties. A semiconductor device can be fabricated with multiple nanosheets using GAA. The process can include a single-step crystallization or recrystallization of two-dimensional channel regions. As one example, a transistor stack of two NMOS transistors can be fabricated as disclosed herein. It is to be understood that present implementations are not limited to a two-transistor stack, and are not limited to an NMOS-only stack. The stack can be greater or less than 1 and the transistors can be fabricated as all-NMOS, all-PMOS, or any combination of NMOS and PMOS.

Figure 1:
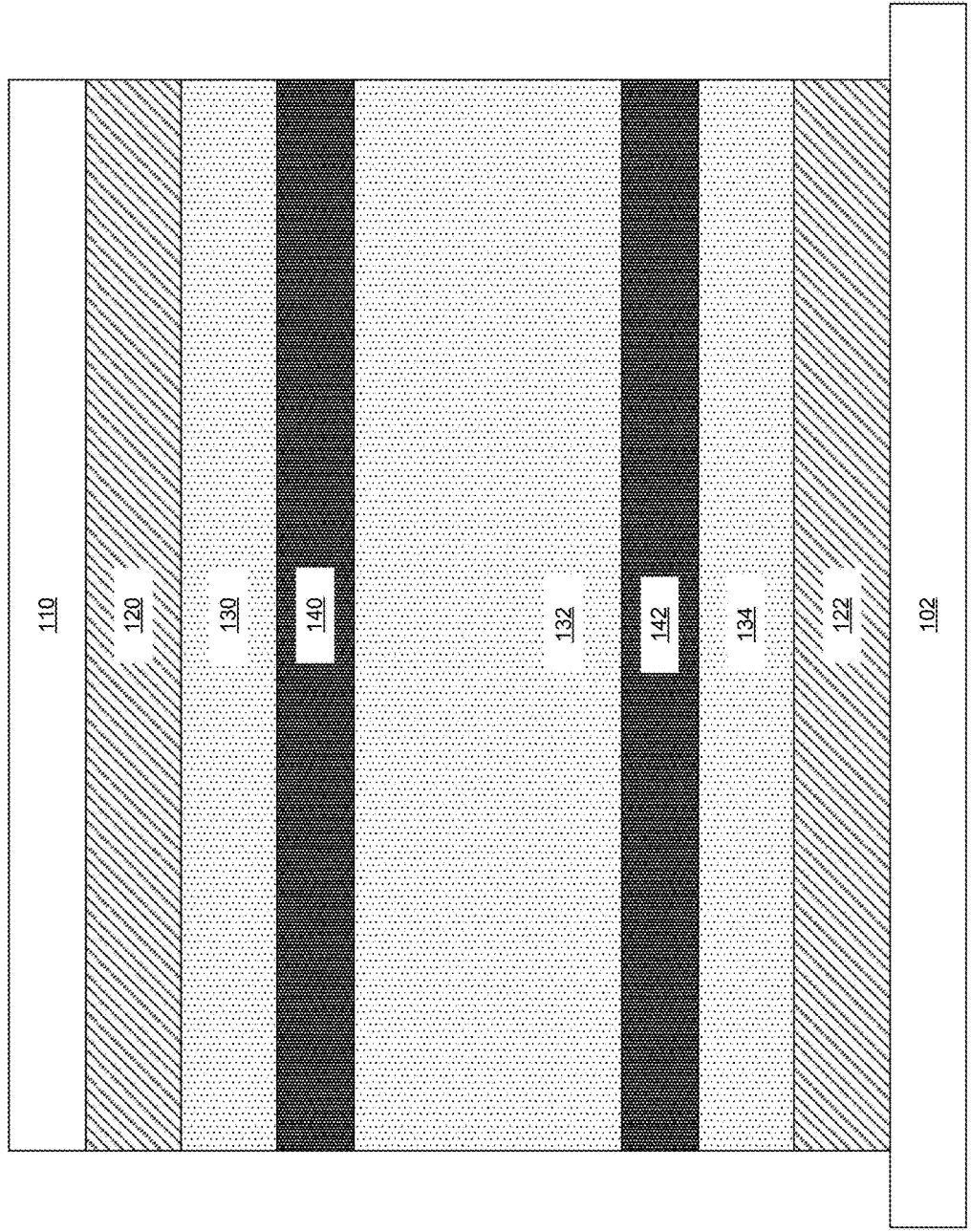
FIG. 1 illustrates a state of a first semiconductor device, according to an embodiment.

FIG. 1 illustrates a state of a first semiconductor device of present implementations. As illustrated by way of example in FIG. 1, an example semiconductor device 100 can include a substrate 102, a device cap layer 110, a first dielectric layer 120, a second dielectric layer 122, a first disposable stack layer 130, a second disposable stack layer 132, a third disposable stack layer 134, a first seed layer 140, and a second seed layer 142. The seed layers 140 and 142 can have an NMOS property. The layers can be stacked as planar layers on the substrate. An order of stacking of the layers can be as illustrated. The seed layers 140 and 142 can include a two-dimensional material. As one example, a two-dimensional material have a planar lattice structure. Two-dimensional materials can include, but are not limited to, $MoTe_2$, $MoS_2$, $WTe_2$, $WS_2$, $InSe$, and $In_2Se_3$. The materials described herein may be deposited by an atomic layer deposition (ALD) process and may be 5-15 angstroms thick, the thinness lending to their name-2D material. Other deposition techniques may also be used, including but not limited to chemical vapor deposition (CVD), physical vapor deposition (PVD), and plasma-enhanced deposition techniques. The materials may be annealed during or after the device formation process to recrystallize or grow the crystals and thereby improve electrical characteristics. The device cap layer 110 may be subsequently removed once crystallization or recrystallization is completed.

Figure 2:
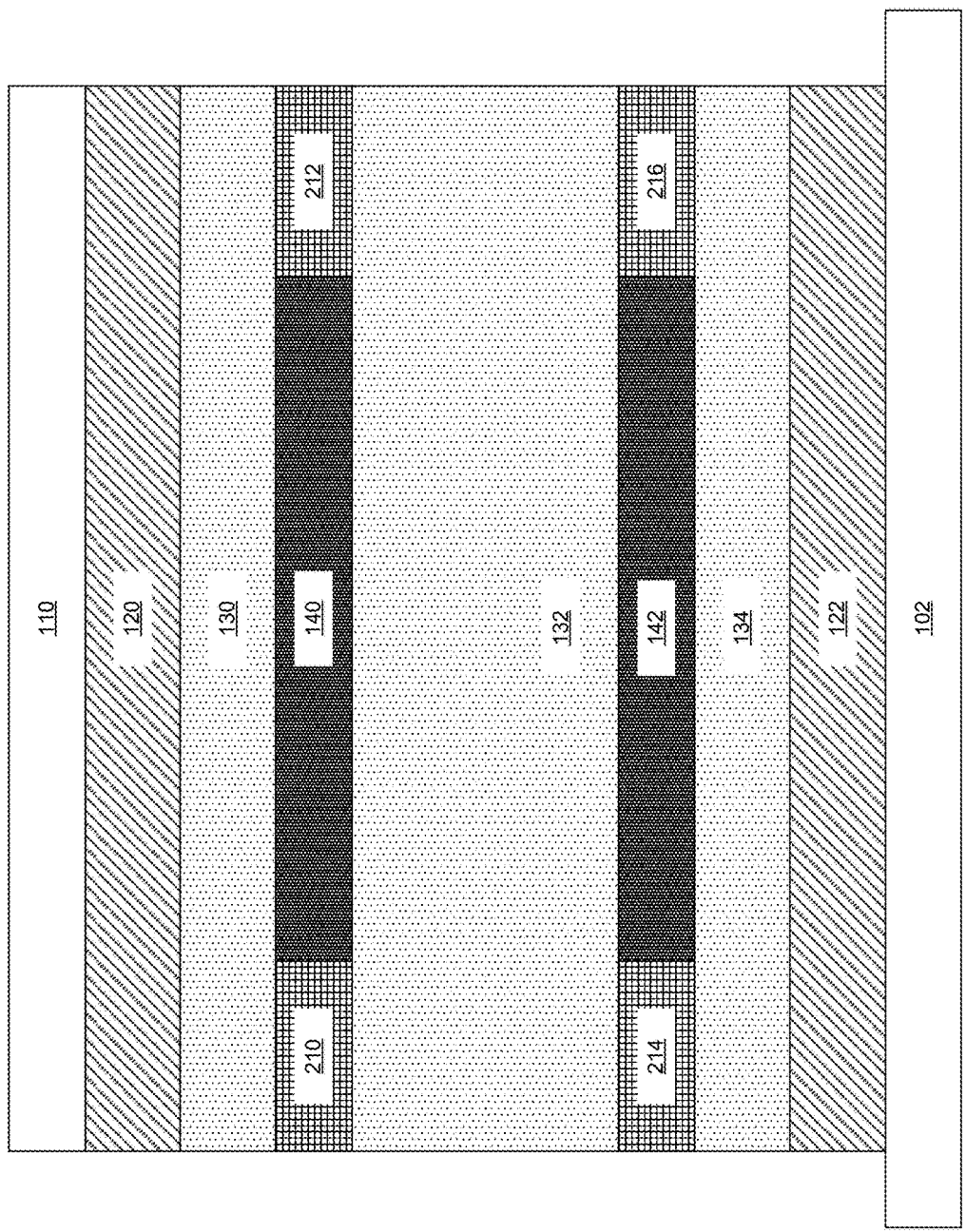
FIG. 2 illustrates a state of a first semiconductor device further to the state of FIG. 1, according to an embodiment.

FIG. 2 illustrates a state of a first semiconductor device further to the state of FIG. 1. As illustrated by way of example in FIG. 2, an example semiconductor device 100 can include the substrate 102, the device cap layer 110, the first dielectric layer 120, the second dielectric layer 122, the first disposable stack layer 130, the second disposable stack layer 132, the third disposable stack layer 134, the first seed layer 140, the second seed layer 142, first source and drain layers 210 and 212, and second source and drain layers 214 and 216. The layers 210, 212, 214 and 216 can include metallic material, and can be disposed level with the first seed layer 140 and the second seed layer 142, respectively. The layers 210, 212, 214 and 216 can be formed by partially removing portions of the first seed layer 140 and the second seed layer 142 at edges of the semiconductor device, and filling the cavities formed by the removal.

Figure 3:
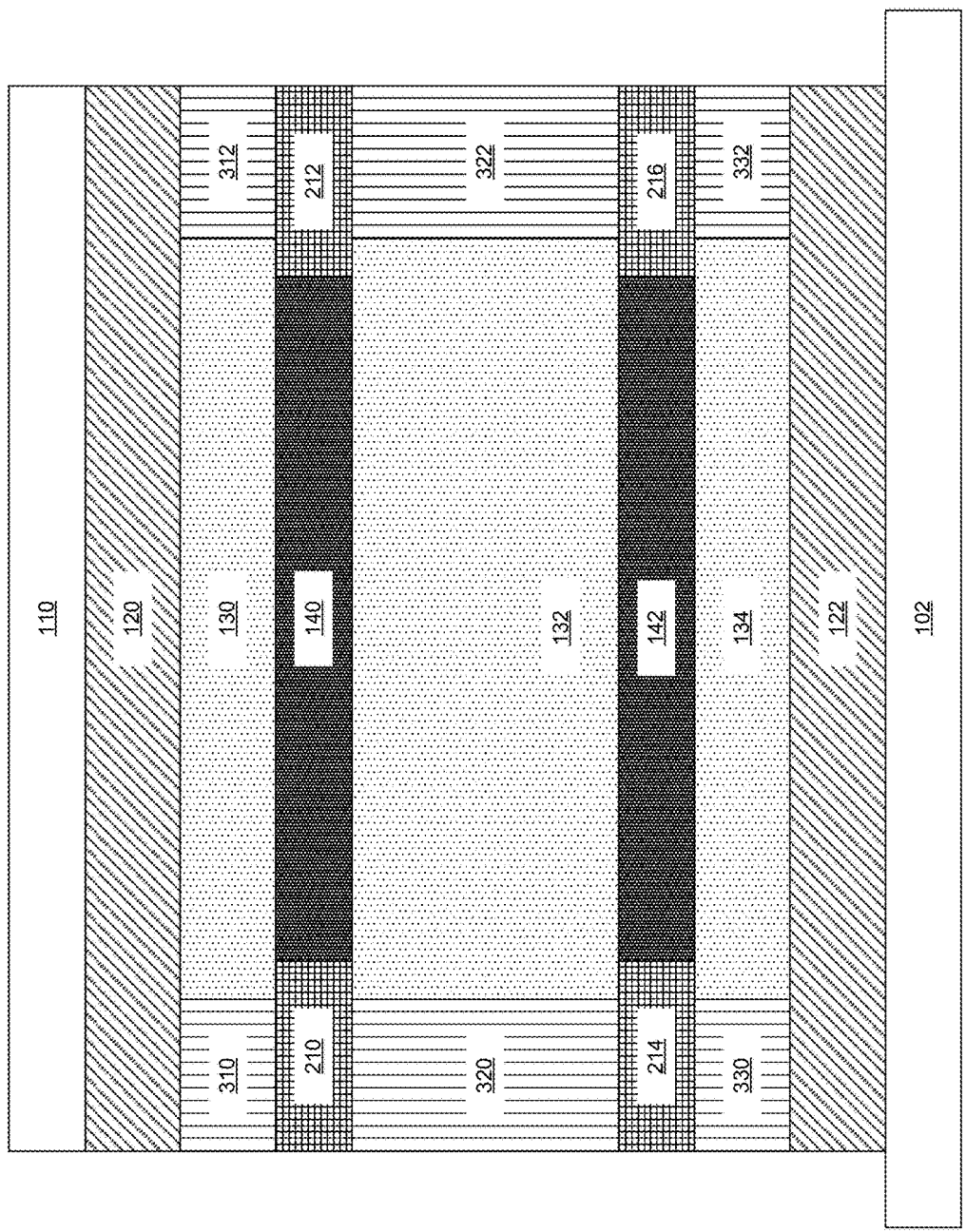
FIG. 3 illustrates a state of a first semiconductor device further to the state of FIG. 2, according to an embodiment.

FIG. 3 illustrates a state of a first semiconductor device further to the state of FIG. 2. As illustrated by way of example in FIG. 3, an example semiconductor device 300 can include the substrate 102, the device cap layer 110, the first dielectric layer 120, the second dielectric layer 122, the first disposable stack layer 130, the second disposable stack layer 132, the third disposable stack layer 134, the first seed layer 140, the second seed layer 142, the first source and drain layers 210 and 212, the second source and drain layers 214 and 216, and dielectric sidewalls 310, 312, 320, 322, 330 and 332.

The dielectric sidewalls can include a dielectric material having a dielectric property different from a dielectric property of the first dielectric layer 120 and the second dielectric layer 122. The dielectric sidewalls 310, 312, 320, 322, 330 and 332 can be formed by partially removing portions of the first, second, and third disposable stack layers at edges of the semiconductor device, and filling the cavities formed by the removal. The dielectric sidewalls 310, 312, 320, 322, 330 and 332 can have a width from the edge of the semiconductor device inward toward that center of the semiconductor device that is less than a corresponding length of the first source and drain layers 210 and 212 and the second source and drain layers 214 and 216. Thus, the first source and drain layers 210 and 212 and the second source and drain layers 214 and 216 can protrude inwardly into contact with the first seed layer 140 and the second seed layer 142, and the first seed layer 140 and the second seed layer 142 can advantageously be electrically isolated from the dielectric sidewalls 310, 312, 320, 322, 330 and 332.

Figure 4:
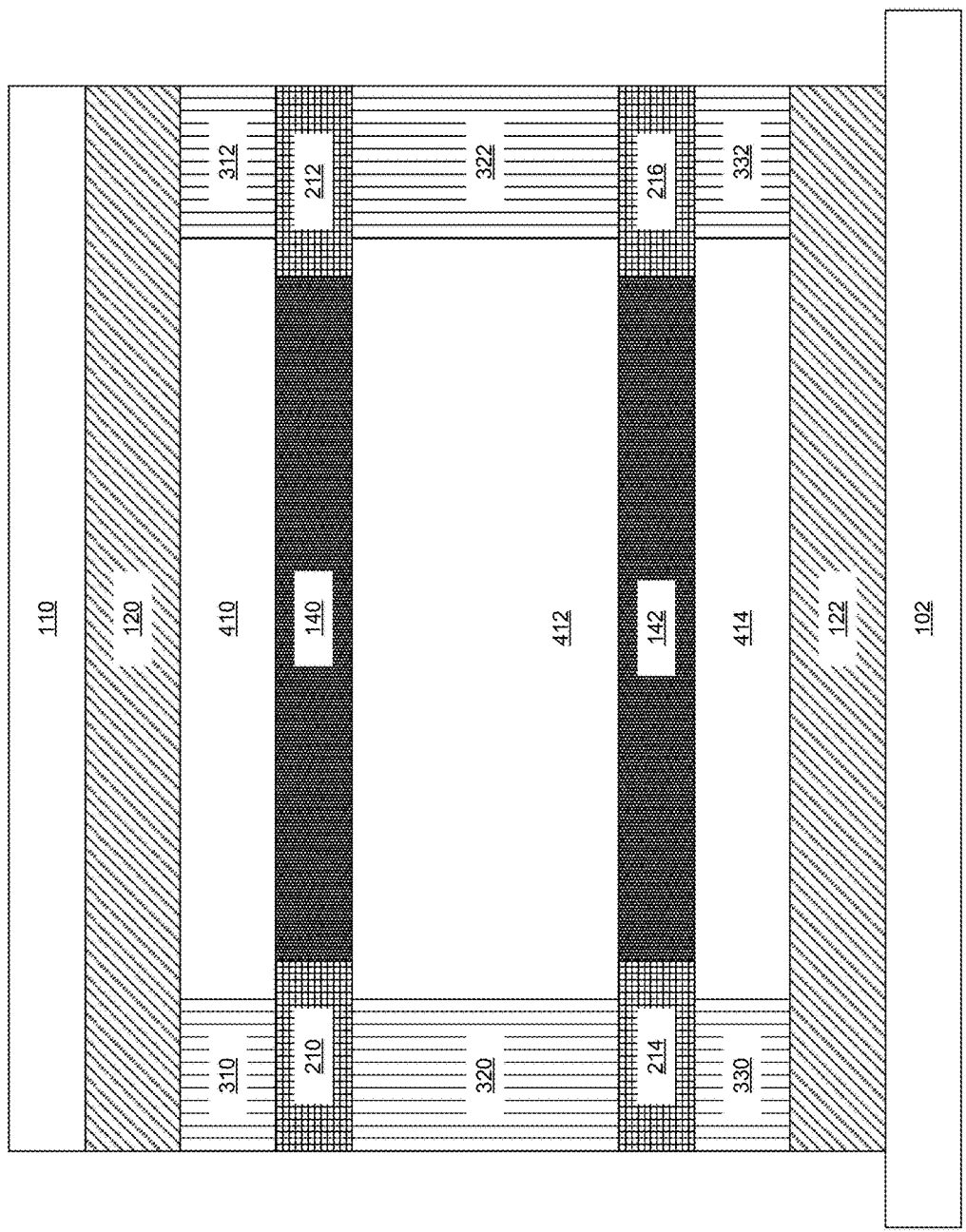
FIG. 4 illustrates a state of a first semiconductor device further to the state of FIG. 3, according to an embodiment.

FIG. 4 illustrates a state of a first semiconductor device further to the state of FIG. 3. As illustrated by way of example in FIG. 4, an example semiconductor device 400 can include the substrate 102, the device cap layer 110, the first dielectric layer 120, the second dielectric layer 122, the first seed layer 140, the second seed layer 142, the first source and drain layers 210 and 212, the second source and drain layers 214 and 216, and the dielectric sidewalls 310, 312, 320, 322, 330 and 332. The first disposable stack layer 130, the second disposable stack layer 132, and the third disposable stack layer 134 are removed to form first, second and third cavities 410, 412 and 414 in the semiconductor device. The layers 130, 132 and 134 can be removed using a mask to expose upper and lower surfaces of each of the seed layers 140 and 142, as well as sidewalls facing toward and away from the plane of the mask. As one example, the mask can be formed to define a pattern that traverses lengthwise across the stacked layers.

Figure 5A:
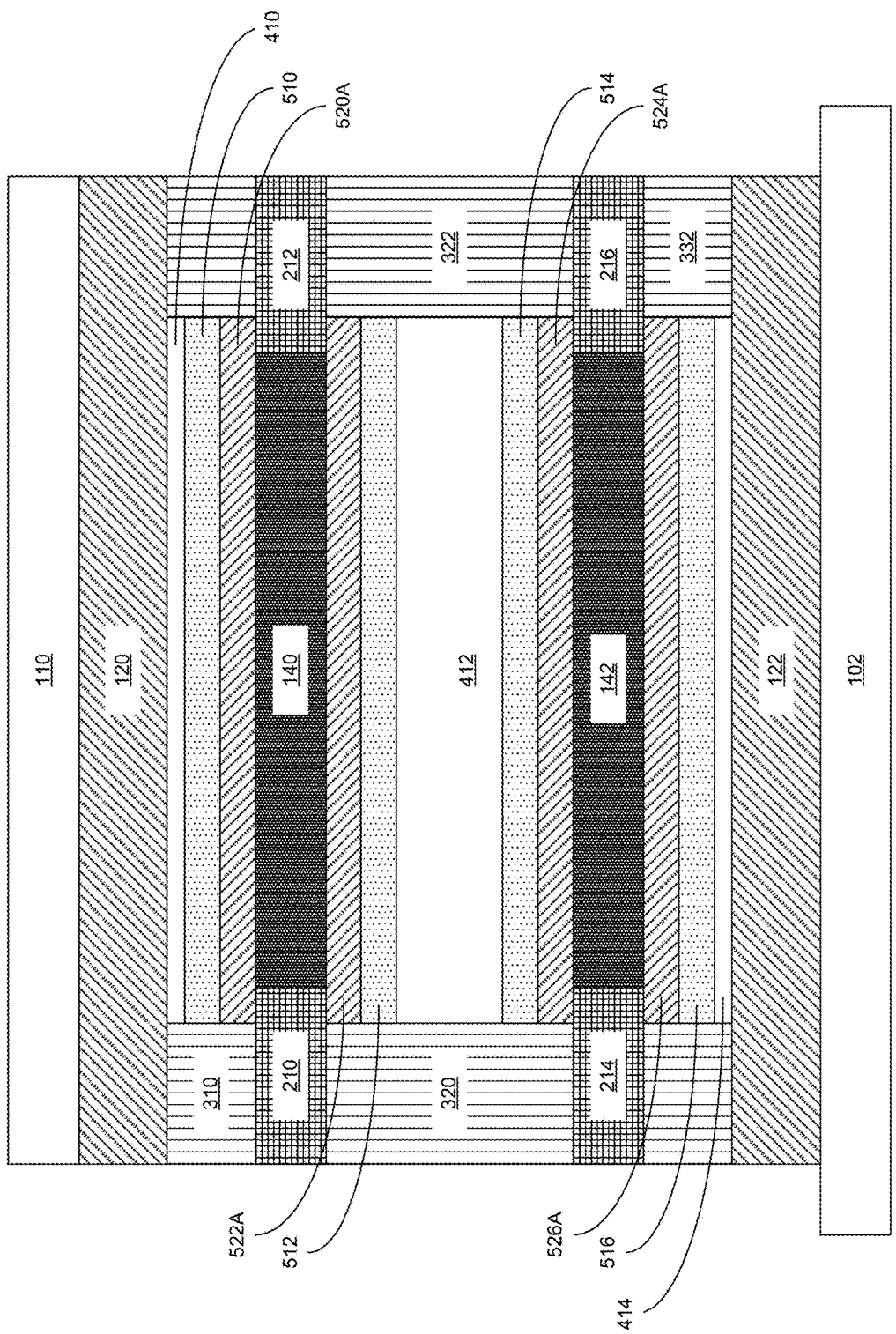
FIG. 5A illustrates a state of a first semiconductor device further to the state of FIG. 4, according to an embodiment.

FIG. 5A illustrates a state of a first semiconductor device further to the state of FIG. 4. As illustrated by way of example in FIG. 5A, an example semiconductor device 500A can include the substrate 102, the device cap layer 110, the first dielectric layer 120, the second dielectric layer 122, the first seed layer 140, the second seed layer 142, the first source and drain layers 210 and 212, the second source and drain layers 214 and 216, the dielectric sidewalls 310, 312, 320, 322, 330 and 332, first, second, third and fourth cap layers 510, 512, 514 and 516, and first, second, third and fourth device layers 520A, 522A, 524A and 526A in a first state.

The first and second cap layers 510 and 512 can be disposed respectively over upper and lower surfaces of the first seed layer 140, and can include a fabrication material different from a material of the device cap layer 110. The third and fourth cap layers 514 and 516 can be disposed respectively over upper and lower surfaces of the second seed layer 142, and can include the fabrication material different from a material of the device cap layer 110. The first, second, third and fourth cap layers 510, 512, 514 and 516 can advantageously protect the first, second, third and fourth device layers 520A, 522A, 524A and 526A from the ambient environment during fabrication.

The first and second device layers 520A and 522A can be disposed respectively over or on upper and lower surfaces of the first seed layer 140, and can include a two-dimensional material different from a two-dimensional material of the seed layers 140 and 142. The third and fourth device layers 524A and 526A can be disposed respectively or on upper and lower surfaces of the second seed layer 142, and can include the two-dimensional material different from the two-dimensional material of the seed layers 140 and 142. The first state can be a state in which the material of the first, second, third and fourth device layers 520A, 522A, 524A and 526A is not crystallized or partially crystallized.

Figure 5B:
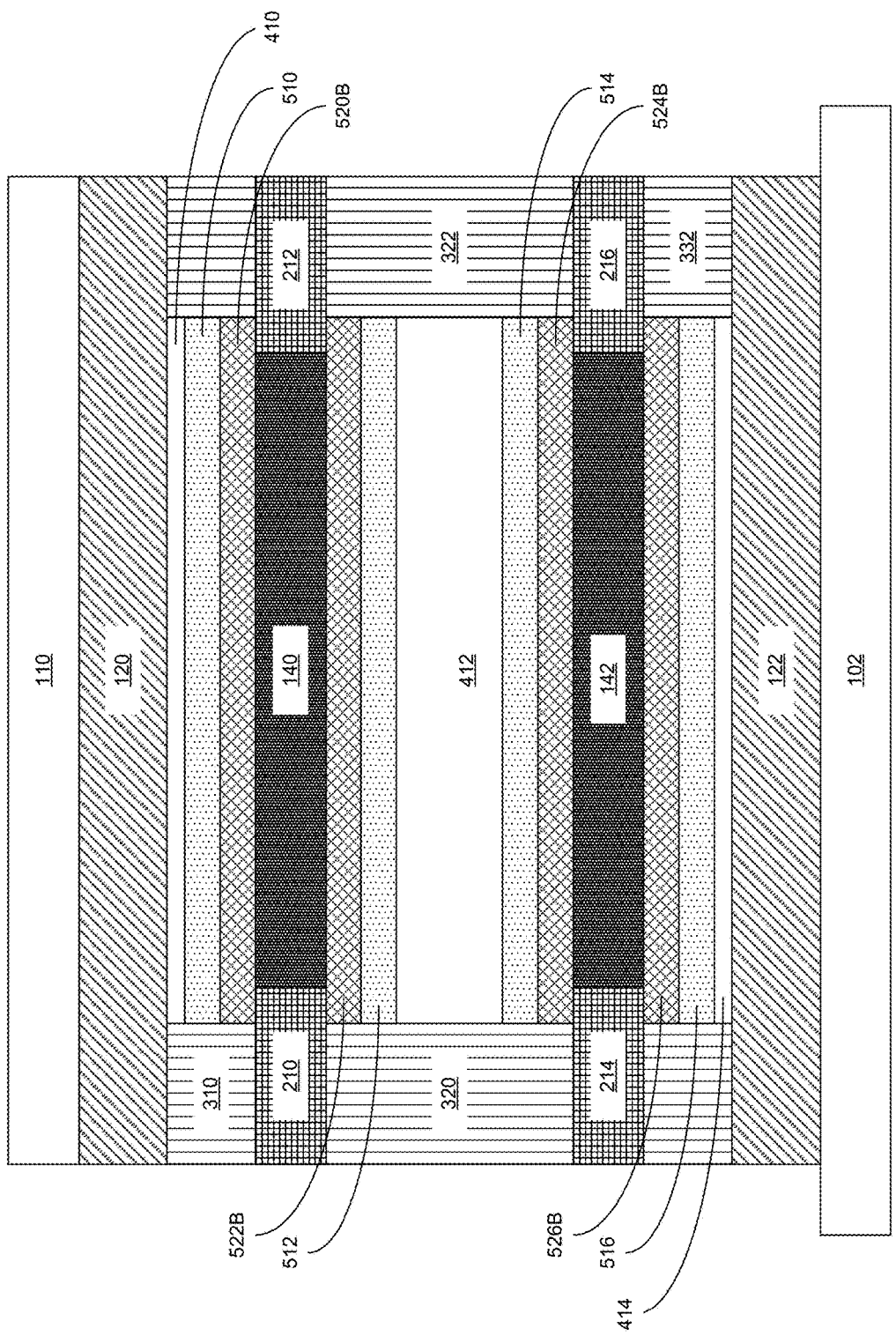
FIG. 5B illustrates a state of a first semiconductor device further to the state of FIG. 5A, according to an embodiment.

FIG. 5B illustrates a state of a first semiconductor device further to the state of FIG. 5A. As illustrated by way of example in FIG. 5B, an example semiconductor device 500B can include the substrate 102, the device cap layer 110, the first dielectric layer 120, the second dielectric layer 122, the first seed layer 140, the second seed layer 142, the first source and drain layers 210 and 212, the second source and drain layers 214 and 216, the dielectric sidewalls 310, 312, 320, 322, 330 and 332, the first, second, third and fourth cap layers 510, 512, 514 and 516, and first, second, third and fourth device layers 520B, 522B, 524B and 526B in a second state.

The first, second, third and fourth device layers 520B, 522B, 524B and 526B can be converted into the second state from the first state by a fabrication process. The fabrication process can include annealing. As a result of the fabrication process, the first, second, third and fourth device layers 520A, 522A, 524A and 526A can be converted into the first, second, third and fourth device layers 520B, 522B, 524B and 526B. The second state can be a state in which the material of the first, second, third and fourth device layers 520B, 522B, 524B and 526B is crystallized from a partially crystallized state or partially crystallized from an uncrystallized state. This crystallization advantageously allows a wider range of two-dimensional materials to be used as the device layers of the semiconductor device.

Figure 6:
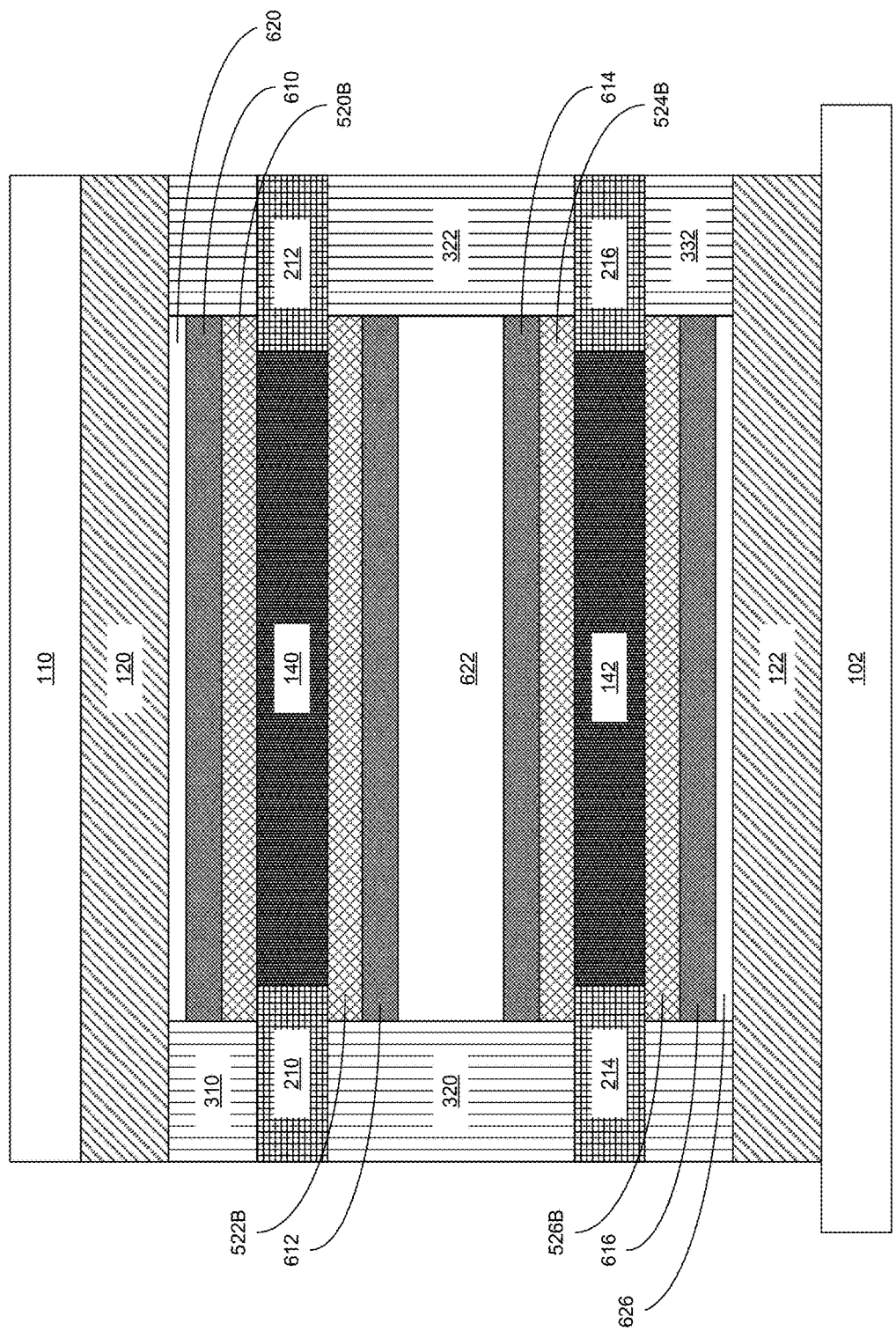
FIG. 6 illustrates a state of a first semiconductor device further to the state of FIG. 5B, according to an embodiment.

FIG. 6 illustrates a state of a first semiconductor device further to the state of FIG. 5B. As illustrated by way of example in FIG. 6, an example semiconductor device 600 can include the substrate 102, the device cap layer 110, the first dielectric layer 120, the second dielectric layer 122, the first seed layer 140, the second seed layer 142, the first source and drain layers 210 and 212, the second source and drain layers 214 and 216, the dielectric sidewalls 310, 312, 320, 322, 330 and 332, the first, second, third and fourth cap layers 510, 512, 514 and 516, the first, second, third and fourth device layers 520B, 522B, 524B and 526B in the second state, first, second, third, and fourth high-K dielectric layers 610, 612, 614 and 616, and first, second and third gate layers 620, 622 and 624.

After the first, second, third and fourth device layers 520B, 522B, 524B and 526B are converted into the second state, the cap layers 510, 512, 514 and 516 are removed. Next, the first and second high-K dielectric layers 610 and 612 can be disposed respectively over or on upper and lower surfaces of the first seed layer 140. The third and fourth high-K dielectric layers 610 and 612 can be disposed respectively over or on upper and lower surfaces of the second seed layer 142. The first, second, third, and fourth high-K dielectric layers 610, 612, 614 and 616 can include a dielectric material having a dielectric constant higher than a dielectric constant of one or more of the dielectric layers 120 and 122, and the dielectric sidewalls 310, 312, 320, 322, 330 and 332. The first, second and third gate layers 620, 622 and 624 can include a metal having an NMOS property, and can be fabricated in accordance with a GAA process. The gate layers can together form one or more gate structures. As one example, the gate layers and the gate structure can include at least one high-K layer and at least one metal layer.

Figure 7:
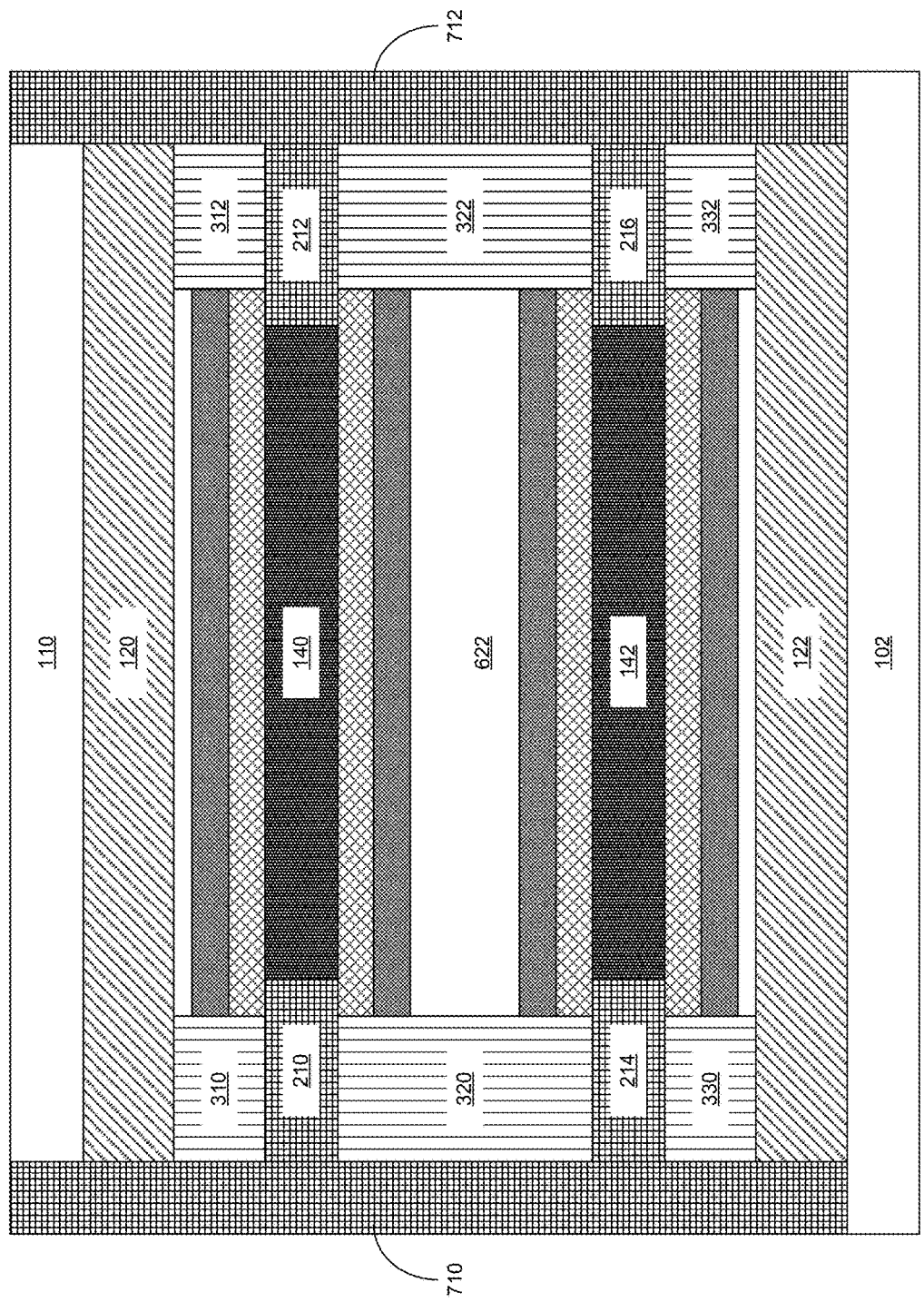
FIG. 7 illustrates a state of a first semiconductor device further to the state of FIG. 6, according to an embodiment.

FIG. 7 illustrates a state of a first semiconductor device further to the state of FIG. 6. As illustrated by way of example in FIG. 7, an example semiconductor device 700 can include the substrate 102, the device cap layer 110, the first dielectric layer 120, the second dielectric layer 122, the first seed layer 140, the second seed layer 142, the first source and drain layers 210 and 212, the second source and drain layers 214 and 216, the dielectric sidewalls 310, 312, 320, 322, 330 and 332, the first, second, third and fourth device layers 520B, 522B, 524B and 526B in the second state, the first, second, third, and fourth high-K dielectric layers 610, 612, 614 and 616, the first, second and third gate layers 620, 622 and 624, and source and drain sidewalls 710 and 712. The source and drain sidewalls 710 and 712 can include a metallic material corresponding to a metallic material of the first source and drain layers 210 and 212, and the second source and drain layers 214 and 216, respectively.

Figure 8:
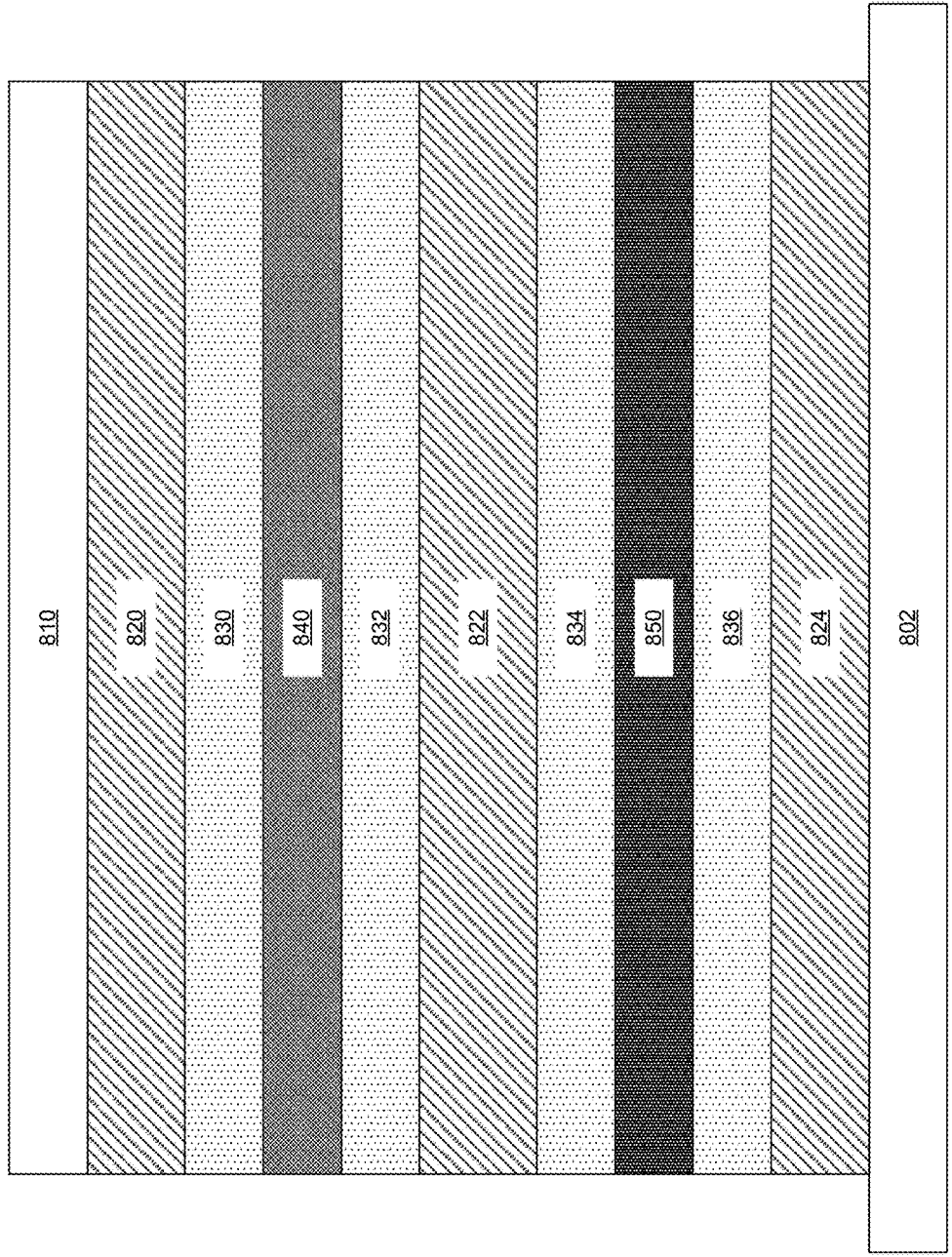
FIG. 8 illustrates a state of a second semiconductor device of present implementations.

FIG. 8 illustrates a state of a second semiconductor device of present implementations. As illustrated by way of example in FIG. 8, an example semiconductor device 800 can include a substrate 802, a device cap layer 810, first, second and third dielectric layers 820, 822 and 824, first, second, third and fourth disposable stack layers 830, 832, 834 and 836, a first seed layer 840, and a second seed layer 850. The first seed layer 840 can have a PMOS property. The second seed layer 850 can have an NMOS property. The layers can be stacked as planar layers on the substrate. An order of stacking of the layers can be as illustrated. The seed layers 840 and 850 can include a two-dimensional material. As one example, a two-dimensional material have a planar lattice structure.

Figure 9:
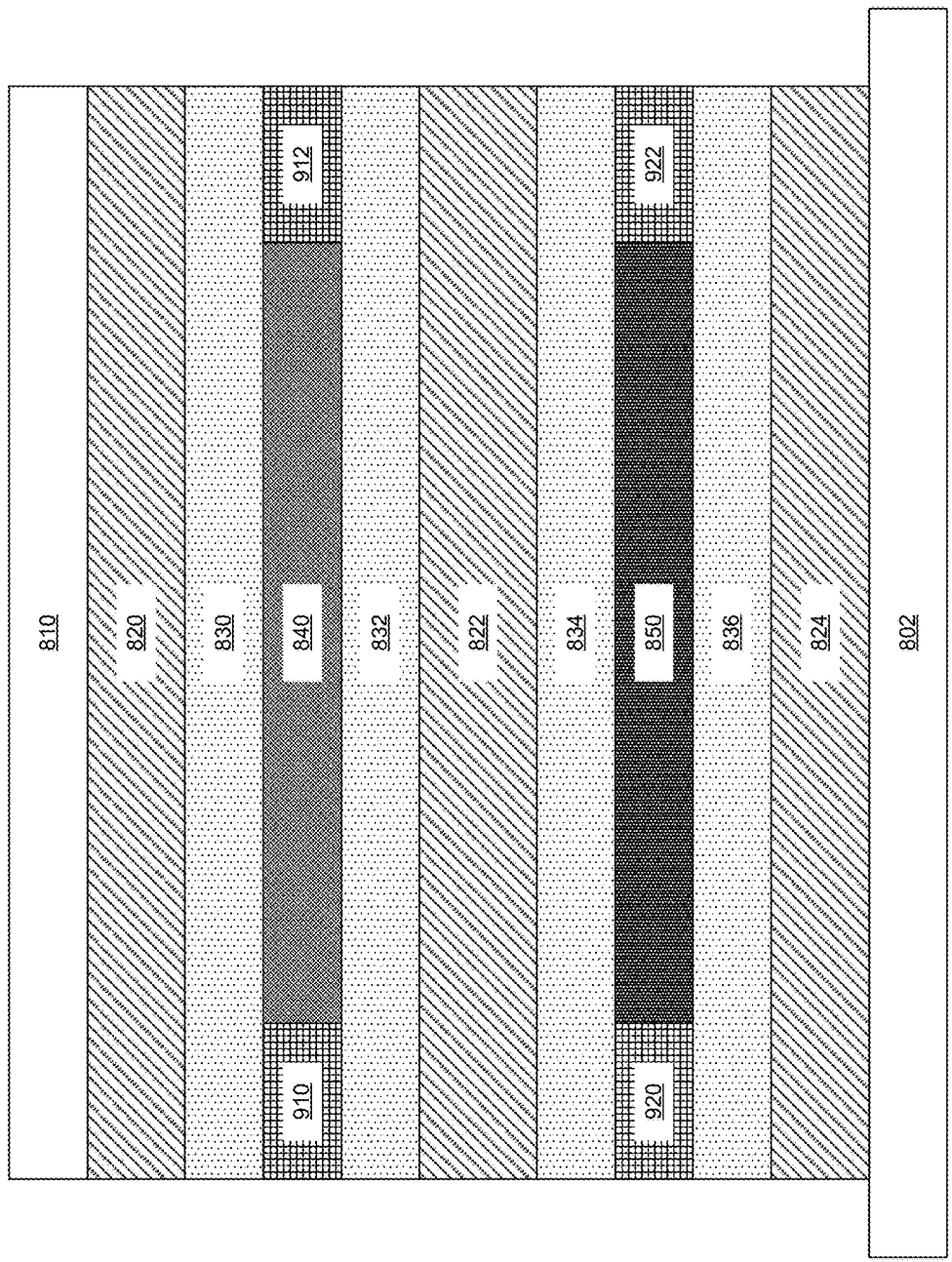
FIG. 9 illustrates a state of a second semiconductor further to the state of FIG. 8, according to an embodiment.

FIG. 9 illustrates a state of a second semiconductor further to the state of FIG. 8. As illustrated by way of example in FIG. 9, an example semiconductor device 900 can include the substrate 802, the device cap layer 810, the first, second and third dielectric layers 820, 822 and 824, the first, second, third and fourth disposable stack layers 830, 832, 834 and 836, the first seed layer 840, the second seed layer 850, first source and drain layers 910 and 912, and second source and drain layers 914 and 916. The layers 910, 912, 914 and 916 can include metallic material, and can be disposed level with the first seed layer 440 and the second seed layer 850, respectively. The layers 910, 912, 914 and 916 can be formed by partially removing portions of the first seed layer 840 and the second seed layer 850 at edges of the semiconductor device, and filling the cavities formed by the removal.

Figure 10:
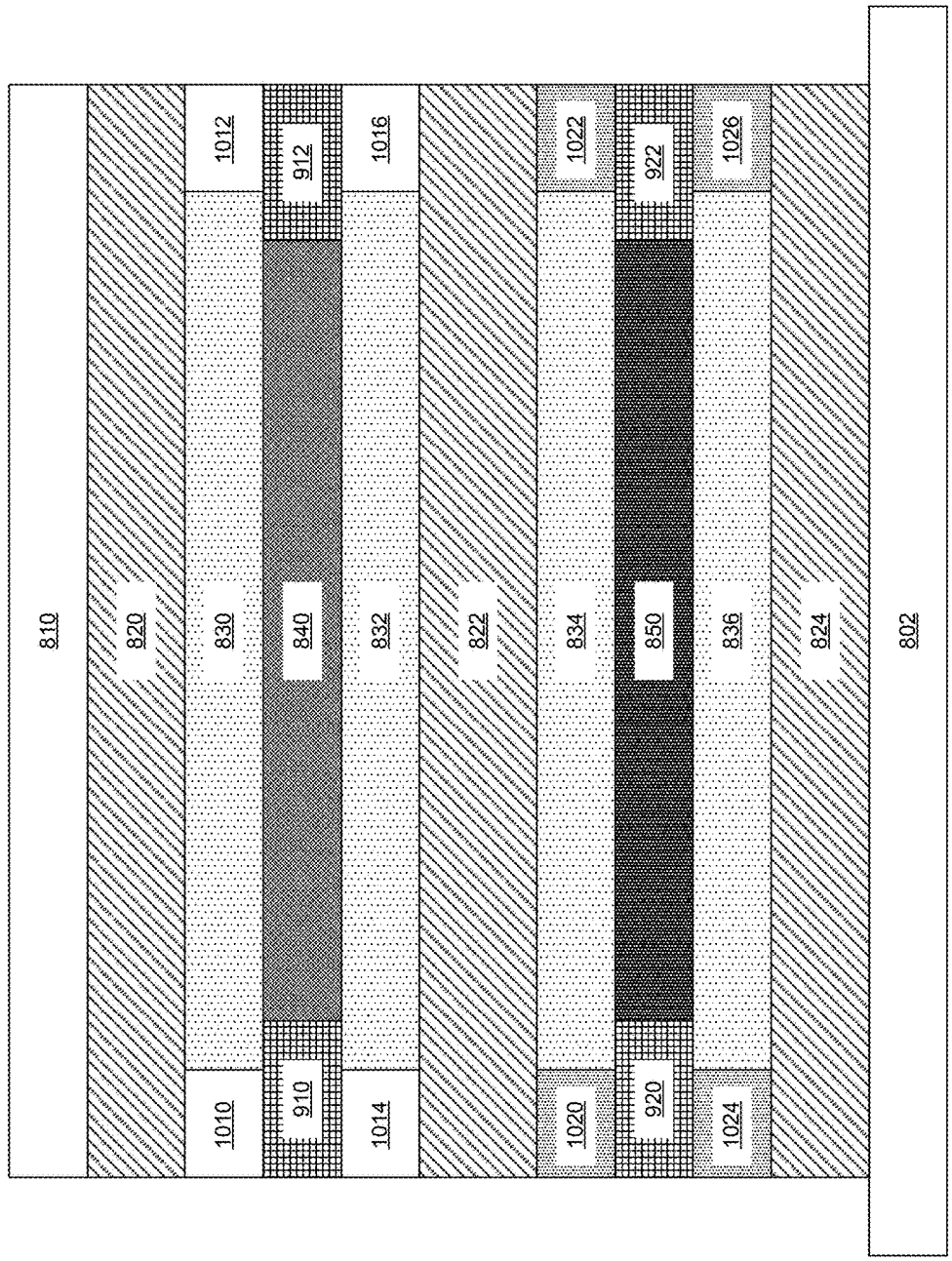
FIG. 10 illustrates a state of a second semiconductor further to the state of FIG. 9, according to an embodiment.

FIG. 10 illustrates a state of a second semiconductor further to the state of FIG. 9. As illustrated by way of example in FIG. 10, an example semiconductor device 1000 can include the substrate 802, the device cap layer 810, the first, second and third dielectric layers 820, 822 and 824, the first, second, third and fourth disposable stack layers 830, 832, 834 and 836, the first seed layer 840, the second seed layer 850, the first source and drain layers 910 and 912, the second source and drain layers 914 and 916, first dielectric sidewalls 1010, 1012, 1014 and 1016, and second dielectric sidewalls 1020, 1022, 1024 and 1026.

The dielectric sidewalls 1010, 1012, 1014,1016, 1020, 1022, 1024 and 1026 can have a width from the edge of the semiconductor device inward toward that center of the semiconductor device that is less than a corresponding length of the first source and drain layers 910 and 912 and the second source and drain layers 914 and 916. Thus, the first source and drain layers 910 and 912 and the second source and drain layers 914 and 916 can protrude inwardly into contact with the first seed layer 840 and the second seed layer 850, and the first seed layer 840 and the second seed layer 850 can advantageously be electrically isolated from the first source and drain layers 910 and 912 and the second source and drain layers 914 and 916. The dielectric sidewalls 1010, 1012, 1014 and 1016 can have a PMOS property. The second dielectric sidewalls 1020, 1022, 1024 and 1026 can have an NMOS property.

Figure 11:
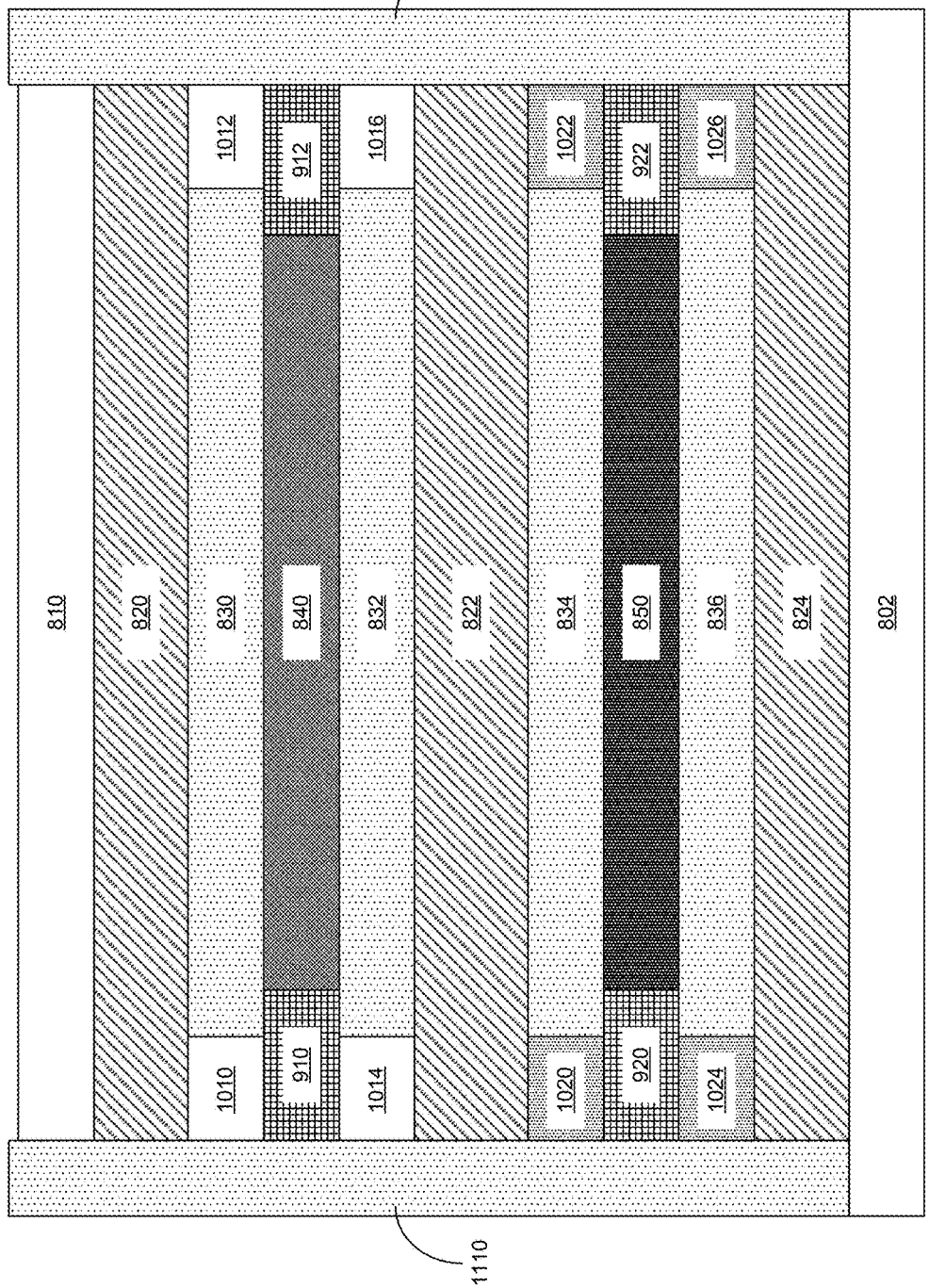
FIG. 11 illustrates a state of a second semiconductor further to the state of FIG. 10, according to an embodiment.

FIG. 11 illustrates a state of a second semiconductor further to the state of FIG. 10. As illustrated by way of example in FIG. 11, an example semiconductor device 1100 can include the substrate 802, the device cap layer 810, the first, second and third dielectric layers 820, 822 and 824, the first, second, third and fourth disposable stack layers 830, 832, 834 and 836, the first seed layer 840, the second seed layer 850, the first source and drain layers 910 and 912, the second source and drain layers 914 and 916, first dielectric sidewalls 1010, 1012, 1014 and 1016, the second dielectric sidewalls 1020, 1022, 1024 and 1026, and outer dielectric sidewalls 1110 and 1112. The outer dielectric sidewalls 1110 and 1112 can form outer sidewalls of the semiconductor device. The outer dielectric sidewalls 1110 and 1112 can include a dielectric material different from that of the first, second and third dielectric layers 820, 822 and 824 and the dielectric sidewalls 1010, 1012, 1014, 1016, 1020, 1022, 1024 and 1026.

Figure 12:
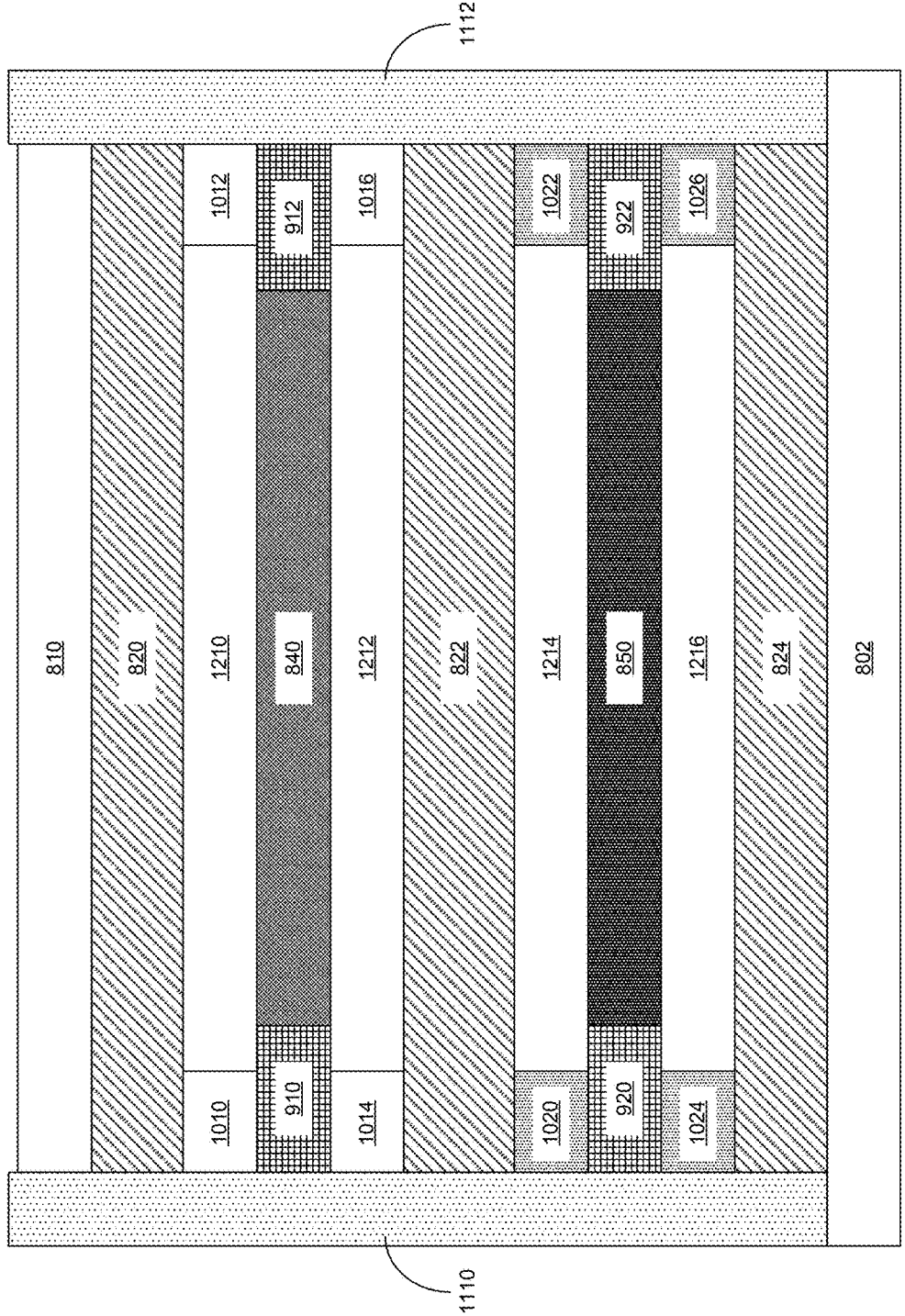
FIG. 12 illustrates a state of a second semiconductor further to the state of FIG. 11, according to an embodiment.

FIG. 12 illustrates a state of a second semiconductor further to the state of FIG. 11. As illustrated by way of example in FIG. 12, an example semiconductor device 1200 can include the substrate 802, the device cap layer 810, the first, second and third dielectric layers 820, 822 and 824, the first seed layer 840, the second seed layer 850, the first source and drain layers 910 and 912, the second source and drain layers 914 and 916, first dielectric sidewalls 1010, 1012, 1014 and 1016, the second dielectric sidewalls 1020, 1022, 1024 and 1026, and the outer dielectric sidewalls 1110 and 1112. The first, second, third and fourth disposable stack layers 830, 832, 834 and 836 are removed to form first, second, third and fourth cavities 1210, 1212, 1214 and 1216 in the semiconductor device. The layers 830, 832, 834 and 836 can be removed using a mask to expose upper and lower surfaces of each of the seed layers 840 and 850, as well as sidewalls facing toward and away from the plane of the mask. As one example, the mask can be formed to define a pattern that traverses lengthwise across the stacked layers.

Figure 13A:
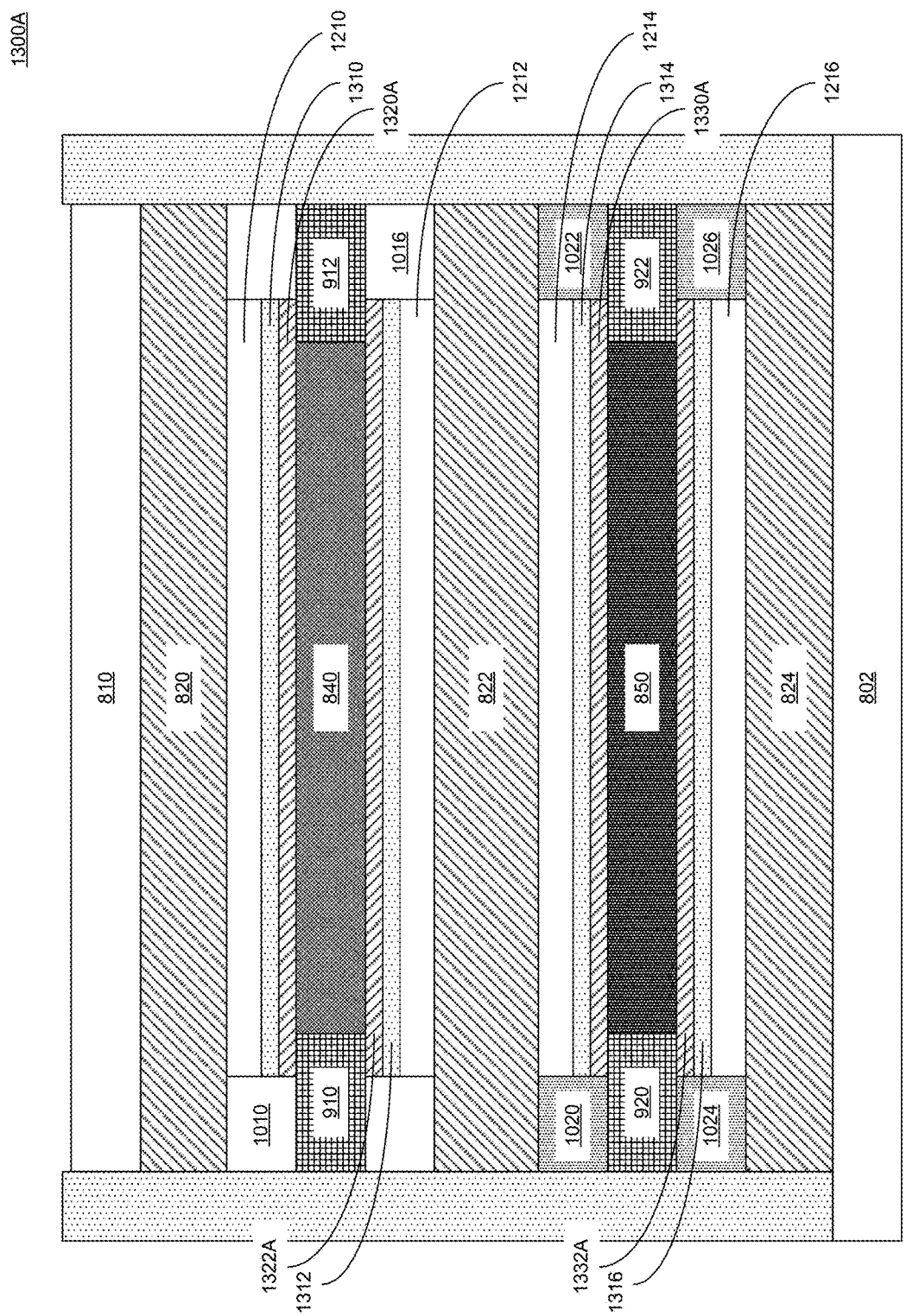
FIG. 13A illustrates a state of a second semiconductor further to the state of FIG. 12, according to an embodiment.

FIG. 13A illustrates a state of a second semiconductor further to the state of FIG. 12. As illustrated by way of example in FIG. 13A, an example semiconductor device 1300A can include the substrate 802, the device cap layer 810, the first, second and third dielectric layers 820, 822 and 824, the first seed layer 840, the second seed layer 850, the first source and drain layers 910 and 912, the second source and drain layers 914 and 916, first dielectric sidewalls 1010, 1012, 1014 and 1016, the second dielectric sidewalls 1020, 1022, 1024 and 1026, the outer dielectric sidewalls 1110 and 1112, first, second, third and fourth cap layers 1310, 1312, 1314 and 1316, and first, second, third and fourth device layers 1320A, 1322A, 1330A and 1332A in a first state.

The first and second cap layers 1310 and 1312 can be disposed respectively over upper and lower surfaces of the first seed layer 840, can include a fabrication material different from a material of the device cap layer 810. The third and fourth cap layers 1314 and 1316 can be disposed respectively over upper and lower surfaces of the second seed layer 850, and can include the fabrication material different from a material of the device cap layer 110. The first, second, third and fourth cap layers 1310, 1312, 1314 and 1316 can advantageously protect the first, second, third and fourth device layers 1320A, 1322A, 1330A and 1332A from the ambient environment during fabrication.

The first and second device layers 1320A and 1322A can be disposed respectively over or on upper and lower surfaces of the first seed layer 840, can include a two-dimensional material different from a two-dimensional material of the seed layers 840 and 850, and can have a PMOS property. The third and fourth device layers 1330A and 1332A can be disposed respectively or on upper and lower surfaces of the second seed layer 850, can include the two-dimensional material different from the two-dimensional material of the seed layers 840 and 850, and can have an NMOS property. The first state can be a state in which the material of the first, second, third and fourth device layers 1320A, 1322A, 1330A and 1332A is not crystallized or partially crystallized.

Figure 13B:
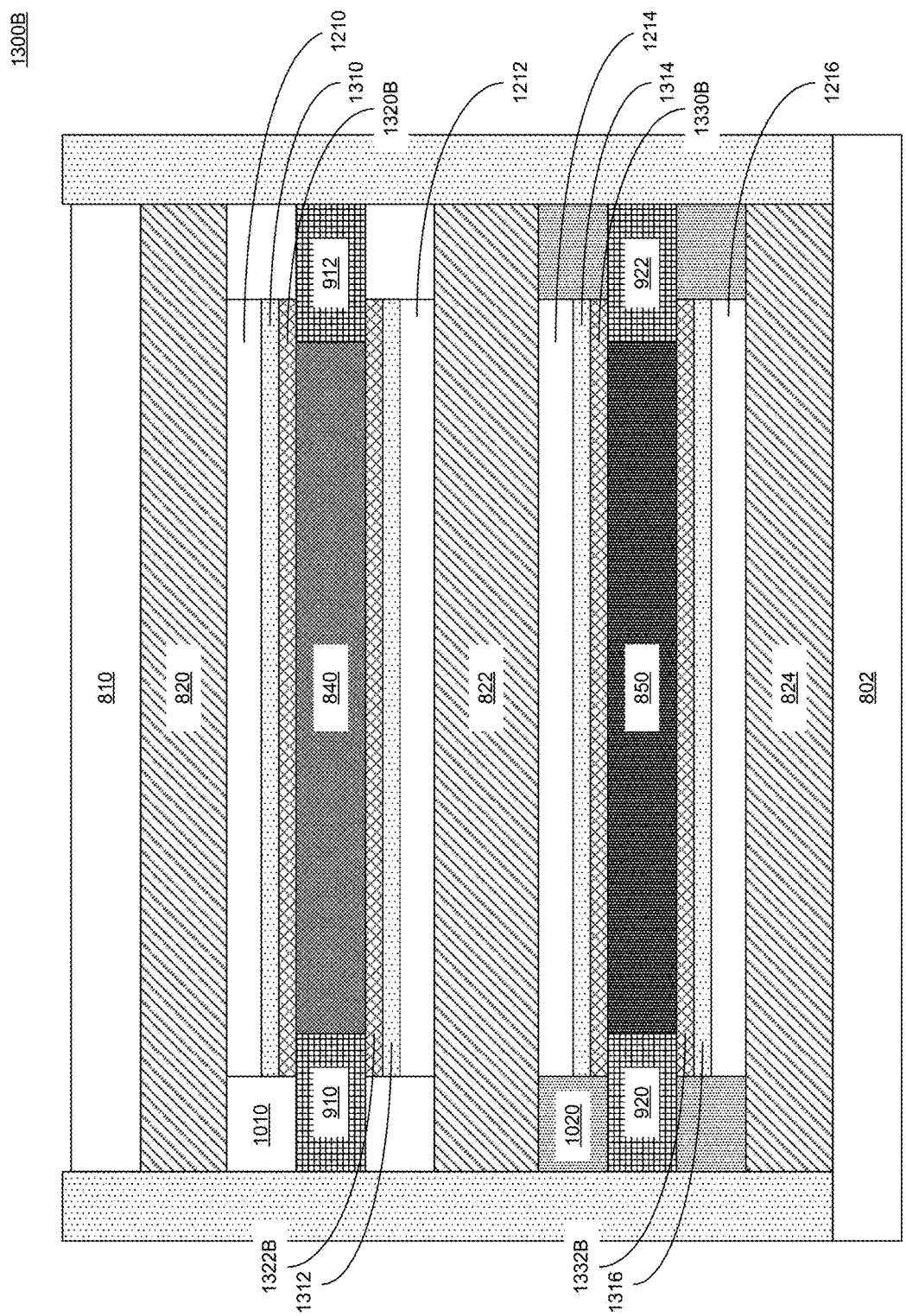
FIG. 13B illustrates a state of a second semiconductor further to the state of FIG. 13A, according to an embodiment.

FIG. 13B illustrates a state of a second semiconductor further to the state of FIG. 13A. As illustrated by way of example in FIG. 13B, an example semiconductor device 1300B can include the substrate 802, the device cap layer 810, the first, second and third dielectric layers 820, 822 and 824, the first seed layer 840, the second seed layer 850, the first source and drain layers 910 and 912, the second source and drain layers 914 and 916, first dielectric sidewalls 1010, 1012, 1014 and 1016, the second dielectric sidewalls 1020, 1022, 1024 and 1026, the outer dielectric sidewalls 1110 and 1112, the first, second, third and fourth cap layers 1310, 1312, 1314 and 1316, and first, second, third and fourth device layers 1320B, 1322B, 1330B and 1332B in a second state.

The first, second, third and fourth device layers 1320B, 1322B, 1330B and 1332B can be converted into the second state from the first state by a fabrication process. The fabrication process can include annealing. As a result of the fabrication process, the first, second, third and fourth device layers 1320A, 1322A, 1330A and 1332A can be converted into the first, second, third and fourth device layers 1320B, 1322B, 1330B and 1332B. The second state can be a state in which the material of the first, second, third and fourth device layers 1320B, 1322B, 1330B and 1332B is crystallized from a partially crystallized state or partially crystallized from an uncrystallized state. This crystallization advantageously allows a wider range of two-dimensional materials to be used as the device layers of the semiconductor device.

Figure 14:
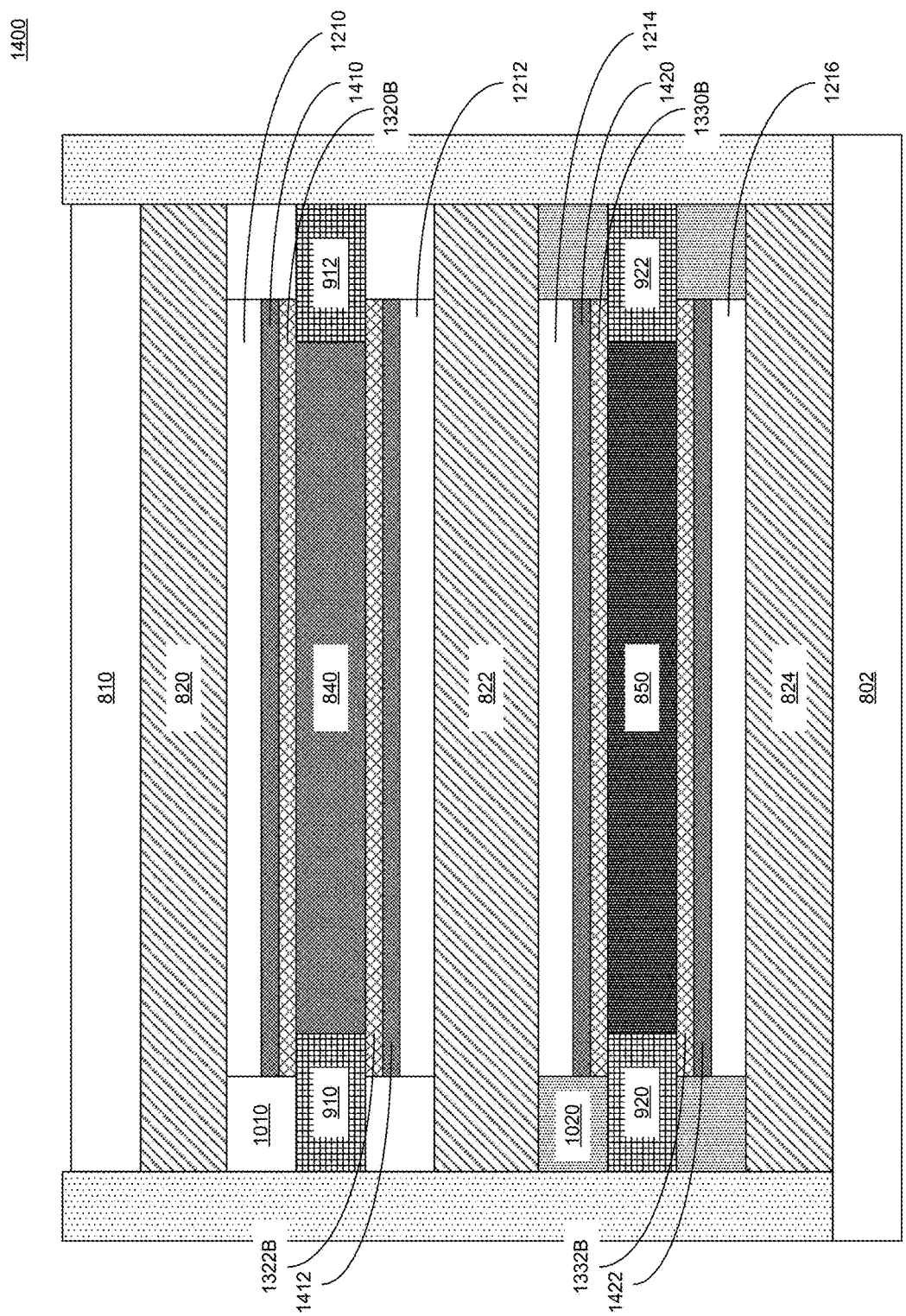
FIG. 14 illustrates a state of a second semiconductor further to the state of FIGS. 13A and 13B, according to an embodiment.

FIG. 14 illustrates a state of a second semiconductor further to the state of FIGS. 13A and 13B. As illustrated by way of example in FIG. 14, an example semiconductor device 1400 can include the substrate 802, the device cap layer 810, the first, second and third dielectric layers 820, 822 and 824, the first seed layer 840, the second seed layer 850, the first source and drain layers 910 and 912, the second source and drain layers 914 and 916, first dielectric sidewalls 1010, 1012, 1014 and 1016, the second dielectric sidewalls 1020, 1022, 1024 and 1026, the outer dielectric sidewalls 1110 and 1112, the first, second, third and fourth cap layers 1310, 1312, 1314 and 1316, and the first, second, third and fourth device layers 1320B, 1322B, 1330B and 1332B in the second state and first, second, third, and fourth high-K dielectric layers 1410, 1412, 1420 and 1422.

The first and second high-K dielectric layers 1410 and 1412 can be disposed respectively over or on upper and lower surfaces of the first seed layer 840. The third and fourth high-K dielectric layers 1420 and 1422 can be disposed respectively over or on upper and lower surfaces of the second seed layer 850. The first, second, third, and fourth high-K dielectric layers 1410, 1412, 1420 and 1422 can include a dielectric material having a dielectric constant higher than a dielectric constant of one or more of the dielectric layers 820, 822 and 824, and the dielectric sidewalls 1010, 1012, 1014,1016, 1020, 1022, 1024 and 1026. The first and second high-K dielectric layers 1410 and 1412 can have a PMOS property, and the third and fourth high-K dielectric layers 1420 and 1422 can have an NMOS property.

Figure 15:
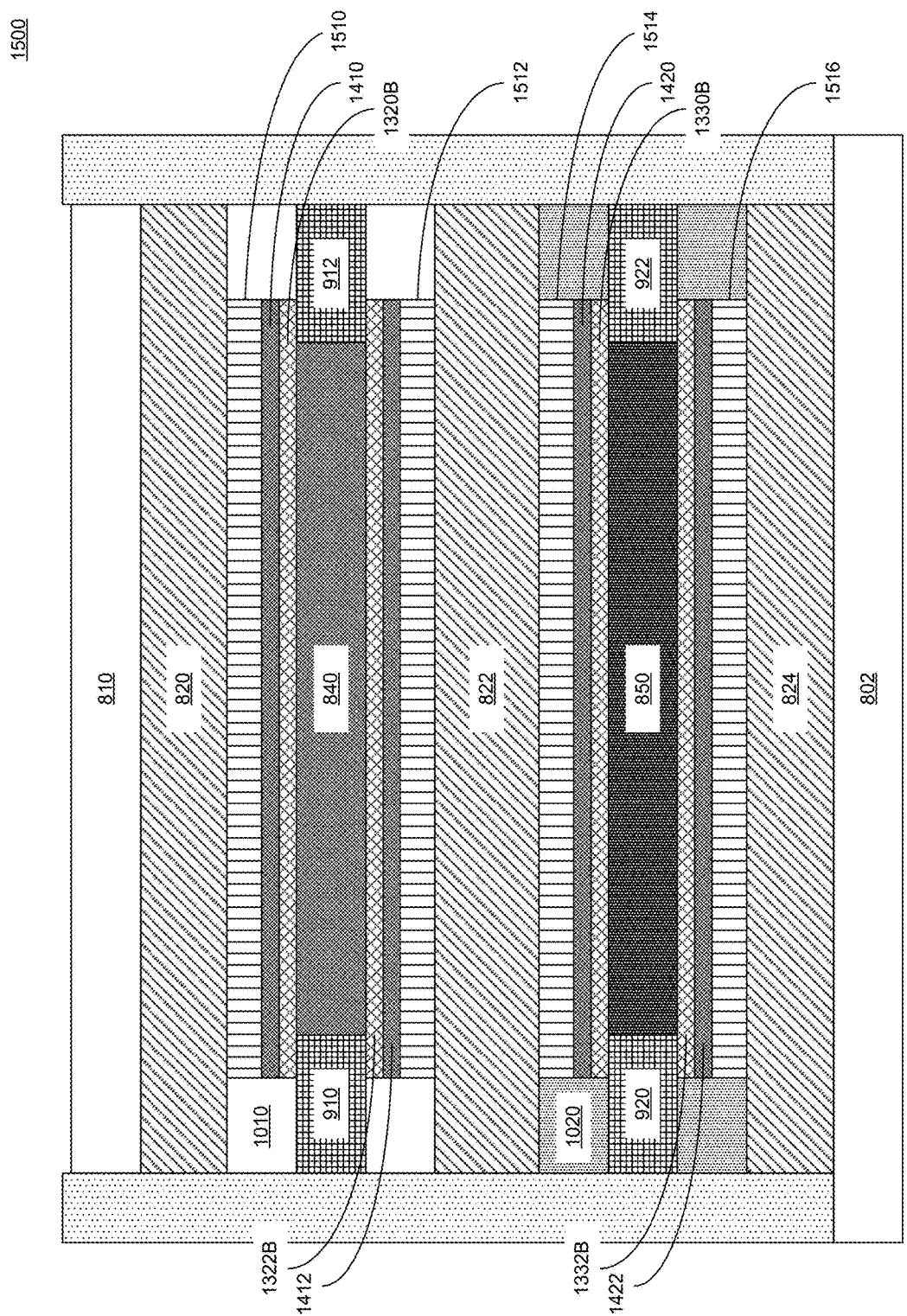
FIG. 15 illustrates a state of a second semiconductor further to the state of FIG. 14, according to an embodiment.

FIG. 15 illustrates a state of a second semiconductor further to the state of FIG. 14. As illustrated by way of example in FIG. 15, an example semiconductor device 1500 can include the substrate 802, the device cap layer 810, the first, second and third dielectric layers 820, 822 and 824, the first seed layer 840, the second seed layer 850, the first source and drain layers 910 and 912, the second source and drain layers 914 and 916, first dielectric sidewalls 1010, 1012, 1014 and 1016, the second dielectric sidewalls 1020, 1022, 1024 and 1026, the outer dielectric sidewalls 1110 and 1112, the first, second, third and fourth cap layers 1310, 1312, 1314 and 1316, and the first, second, third and fourth device layers 1320B, 1322B, 1330B and 1332B in the second state the first, second, third, and fourth high-K dielectric layers 1410, 1412, 1420 and 1422 and first, second, third and fourth gate layers 1510, 1512, 1514 and 1516. The first, second, third and fourth gate layers 1510, 1512, 1514 and 1516 can be fabricated in accordance with a GAA process. The gate layers can together form one or more gate structures. As one example, the gate layers and the gate structure can include at least one high-K layer and at least one metal layer.

Figure 16:
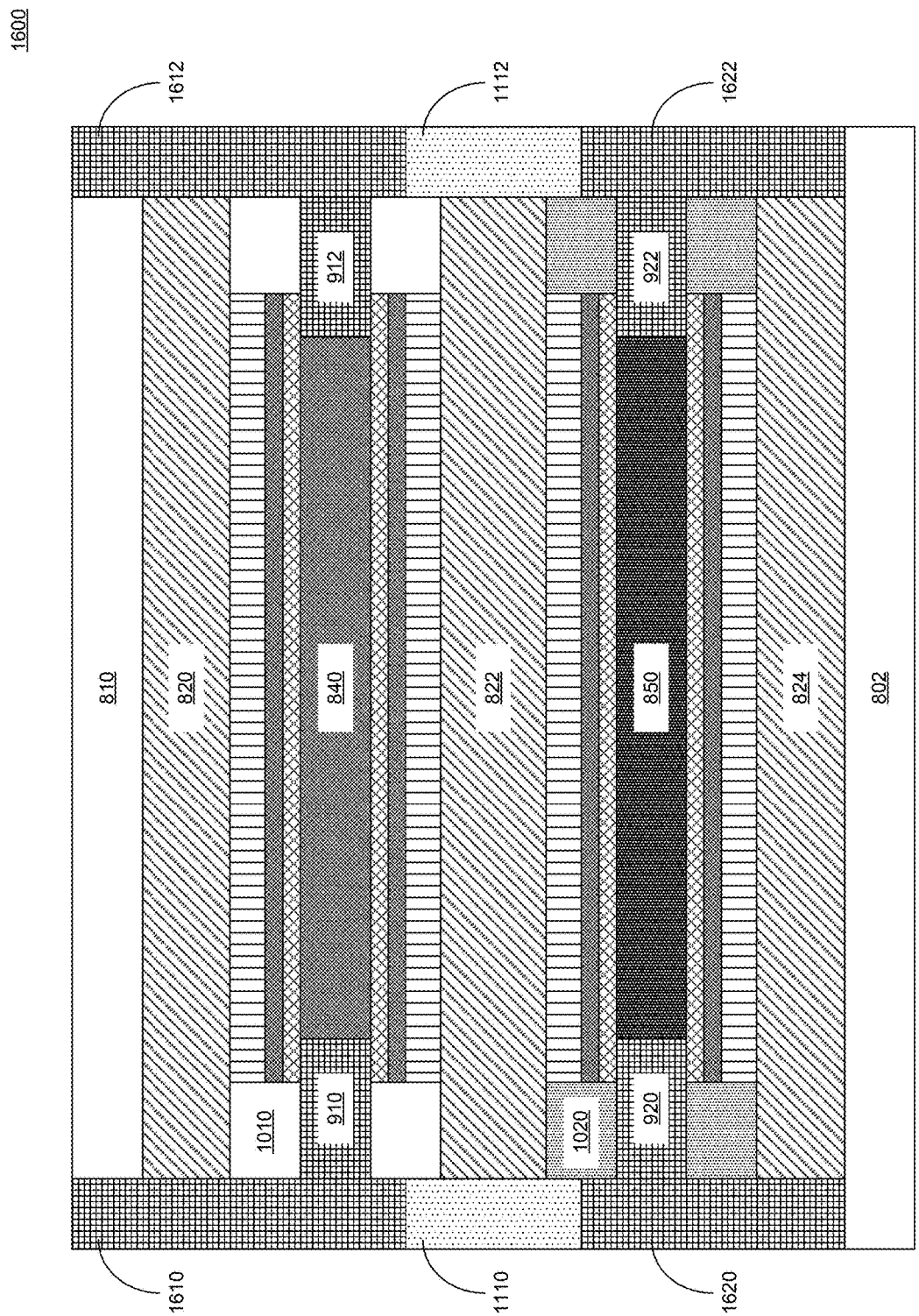
FIG. 16 illustrates a state of a second semiconductor further to the state of FIG. 15, according to an embodiment.

FIG. 16 illustrates a state of a second semiconductor further to the state of FIG. 15. As illustrated by way of example in FIG. 16, an example semiconductor device 1600 can include the substrate 802, the device cap layer 810, the first, second and third dielectric layers 820, 822 and 824, the first seed layer 840, the second seed layer 850, the first source and drain layers 910 and 912, the second source and drain layers 914 and 916, first dielectric sidewalls 1010, 1012, 1014 and 1016, the second dielectric sidewalls 1020, 1022, 1024 and 1026, the outer dielectric sidewalls 1110 and 1112, the first, second, third and fourth cap layers 1310, 1312, 1314 and 1316, and the first, second, third and fourth device layers 1320B, 1322B, 1330B and 1332B in the second state the first, second, third, and fourth high-K dielectric layers 1410, 1412, 1420 and 1422, the first, second, third and fourth gate layers 1510, 1512, 1514 and 1516, first source and drain terminals 1610 and 1612, and second source and drain terminals 1620 and 1622.

The source and drain terminals 1610, 1612, 1620 and 1622 can have a width from the edge of the semiconductor device inward toward that center of the semiconductor device that corresponds to a length of the outer dielectric sidewalls 1110 and 1112. Thus, the source and drain terminals 1610, 1612, 1620 and 1622 can form device sidewalls flush with the outer dielectric sidewalls 1110 and 1112. The source and drain terminals 1610, 1612, 1620 and 1622 can be formed by removing (e.g., wet and/or day etching) portions of the outer dielectric sidewalls 1110 and 1112, followed by refilling those removed portions with a metal material. The first source and drain terminals 1610 and 1612 can have a PMOS property corresponding to a PMOS property of the first source and drain layers 910 and 912. The second source and drain terminals 1620 and 1622 can have an NMOS property corresponding to an NMOS property of the second source and drain layers 914 and 916.

Figure 17:
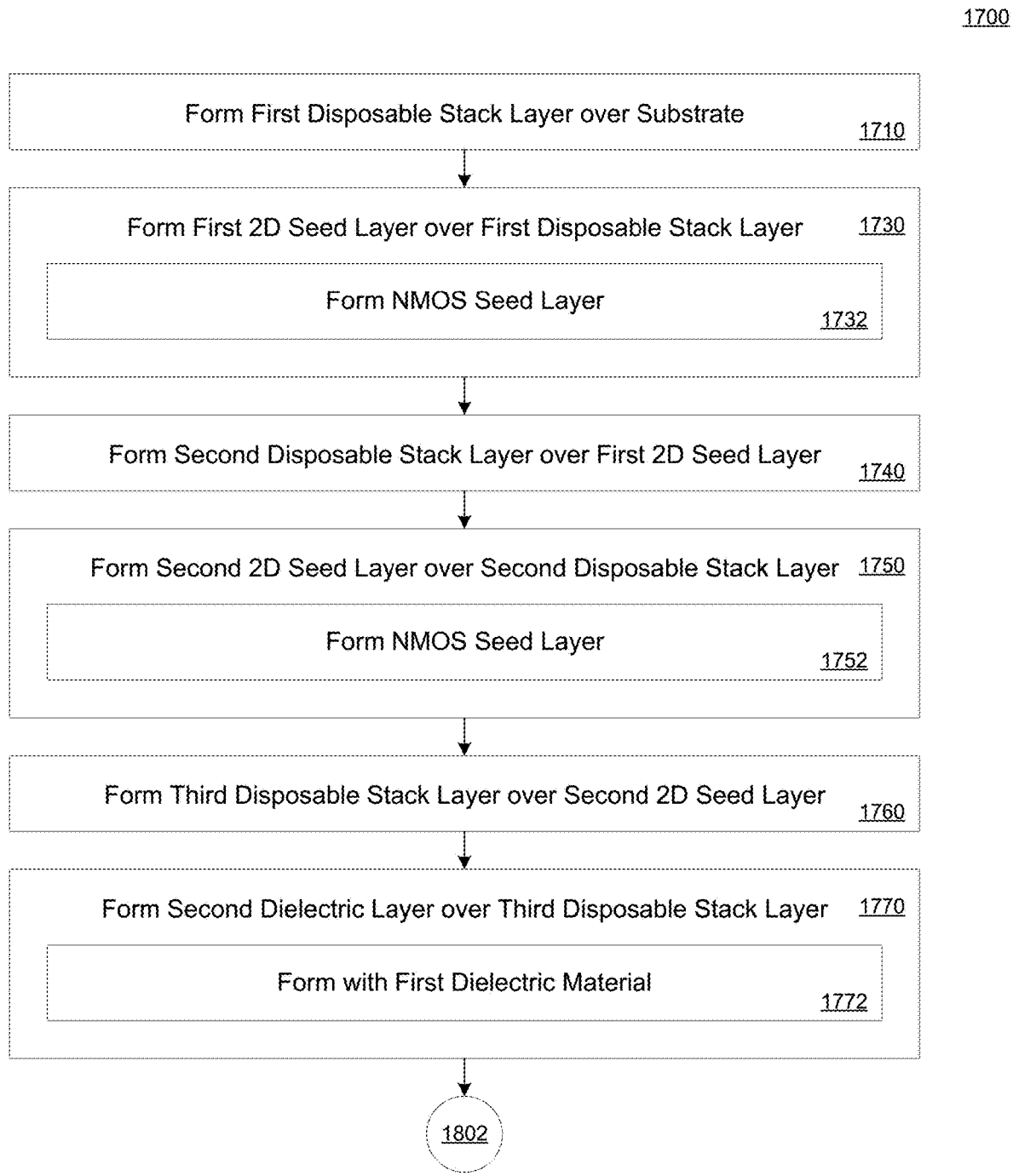
FIG. 17 illustrates a method of manufacturing a first semiconductor device, according to an embodiment.

FIG. 17 illustrates a method of manufacturing a first semiconductor device in accordance with present implementations. The method 1700 can manufacture one or more of the devices in states 100-700 according to present implementations. The method 1700 can begin at step 1710.

At step 1710, the method can form a first disposable stack layer over a substrate. The method 1700 can then continue to step 1730.

At step 1730, the method can form a first seed layer over the first disposable stack layer. The first seed layer can include a two-dimensional material having a two-dimensional structure. Step 1730 can include step 1732. At step 1732, the method can form the first two-dimensional layer as an NMOS seed layer. The method 1700 can then continue to step 1740. At step 1740, the method can form a second disposable stack layer over the first two-dimensional seed layer. The method 1700 can then continue to step 1750.

At step 1750, the method can form a second seed layer over a second disposable stack layer. The first seed layer can include a two-dimensional material having a two-dimensional structure corresponding to the first seed layer. Step 1750 can include step 1752. At step 1752, the method can form the second two-dimensional layer as an NMOS seed layer. The method 1700 can then continue to step 1760. At step 1760, the method can form a third disposable stack layer over the second two-dimensional seed layer. The method 1700 can then continue to step 1770. At step 1770, the method can form a second dielectric layer over the third disposable stack layer. Step 1770 can include step 1772. Each of the disposable stack layers can include the same material. In some other embodiments, one or more of the disposable stack layers can have a different material then other disposable stack layers, while remaining within the scope of present disclosure. At step 1772, the method can form the second dielectric layer with the first dielectric material. The method 1700 can then continue to step 1802.

Figure 18:
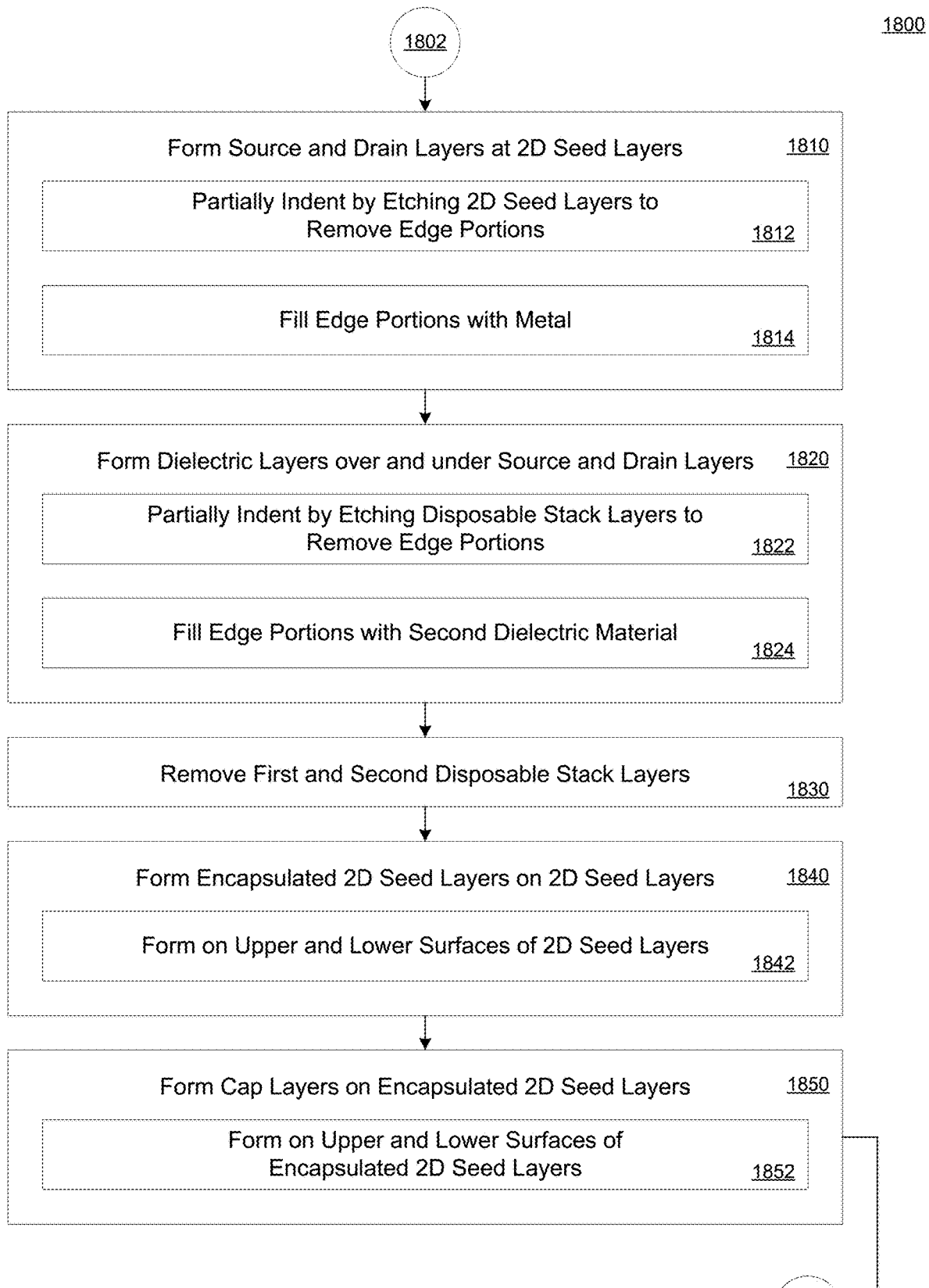
FIG. 18 illustrates a method of manufacturing a first semiconductor device further to the method of FIG. 17, according to an embodiment.

FIG. 18 illustrates a method of manufacturing a first semiconductor device further to the method of FIG. 17. The method 1800 can manufacture one or more of the devices in states 100-700 according to present implementations. The method 1800 can begin at step 1802. The method 1800 can then continue to step 1810.

At step 1810, the method can form source and drain layers at the two-dimensional seed layers. Step 1810 can include at least one of steps 1812 and 1814. At step 1812, the method can partially indent the semiconductor device by etching the seed layers to remove edge portions of the seed layers. At step 1814, the method can fill the edge portions with metal. The method 1800 can then continue to step 1820. At step 1820, the method can form dielectric layers over and under the source and drain layers. Step 1820 can include at least one of steps 1822 and 1824. At step 1822, the method can partially indent the semiconductor device by etching disposable stack layers to remove edge portions of the seed layers. At step 1824, the method can fill the edge portions with metal. The method 1800 can then continue to step 1830. At step 1830, the method can remove the first and second disposable stack layers. The method 1800 can then continue to step 1840.

At step 1840, the method can form encapsulated seed layers on the first and second seed layers. Step 1840 can include step 1842. At step 1842, the method can form the encapsulated seed layers on upper and lower surfaces of the seed layers. The upper and lower surfaces of the seed layers can be exposed subsequent to the removal of the first and second disposable stack layers. The method 1800 can then continue to step 1850. At step 1850, the method can for cap layers on the encapsulated seed layers. Step 1850 can include step 1852. At step 1852, the method can form the cap layers on upper and lower surfaces of the encapsulated seed layers. The cap layers can provide protection from the ambient environment for the encapsulated seed layers, during a crystallization process of the encapsulated seed layers. The method 1800 can then continue to step 1902.

Figure 19:
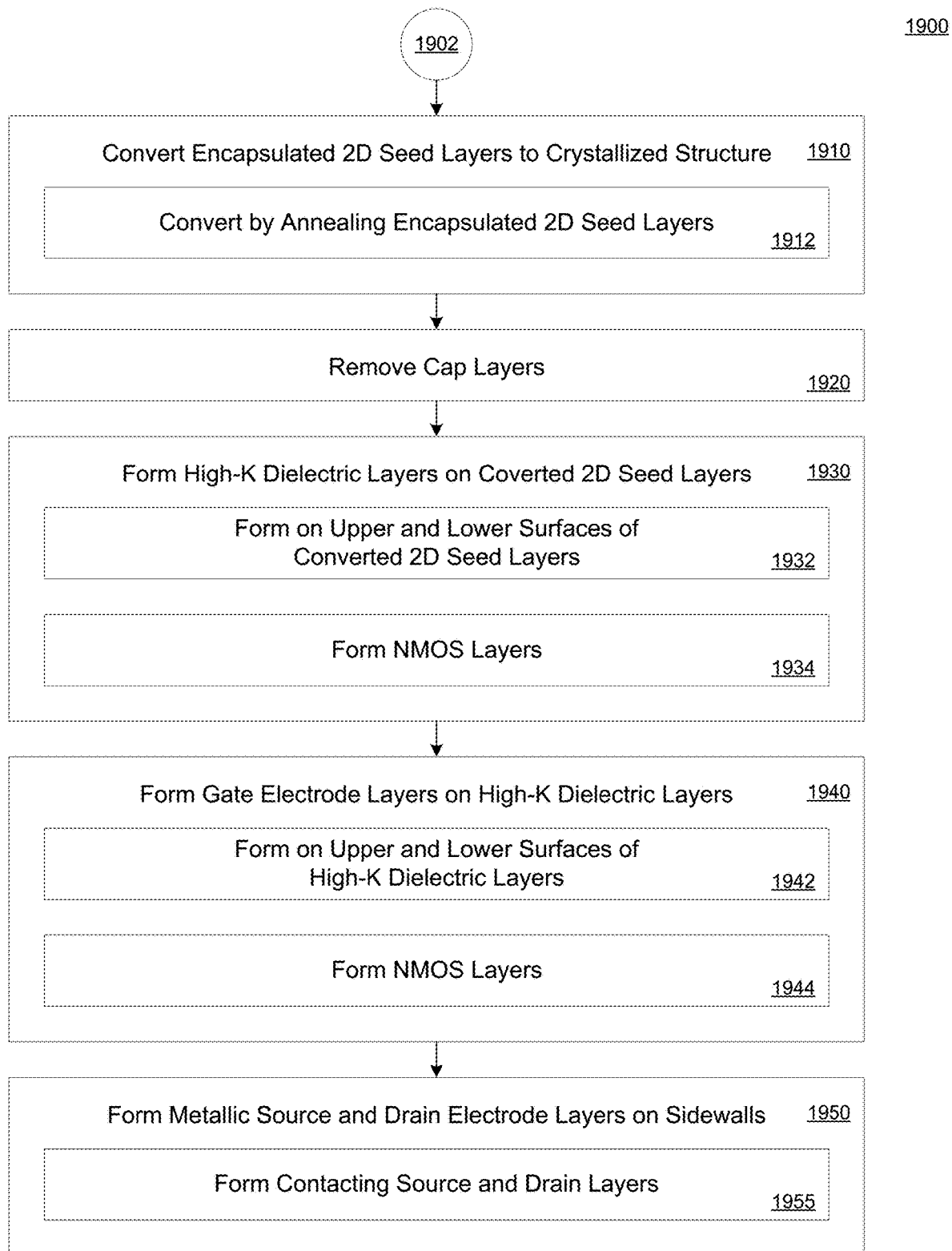
FIG. 19 illustrates a method of manufacturing a first semiconductor device further to the method of FIG. 18, according to an embodiment.

FIG. 19 illustrates a method of manufacturing a first semiconductor device further to the method of FIG. 18. The method 1900 can manufacture one or more of the devices in states 100-700 according to present implementations. The method 1900 can begin at step 1902. The method 1900 can then continue to step 1910.

At step 1910, the method can convert the encapsulated seed layers to a crystallized structure. The conversion can include converting a flat or planar lattice structure of the layer to a three-dimensional (3D) crystalline structure. Step 1910 can include step 1912. At step 1912, the method can convert the encapsulated seed layers by annealing the encapsulated seed layers. The method 1900 can then continue to step 1920. At step 1920, the method can remove the cap layers. The method 1900 can then continue to step 1930.

At step 1930, the method can form high-K dielectric layers on the converted seed layers. Step 1930 can include at least one of steps 1932 and 1934. At step 1932, the method can form the high-K dielectric layers on upper and lower surfaces of the converted seed layers. At step 1934, the method can form high-K dielectric layers having an NMOS property. The method 1900 can then continue to step 1940. At step 1940, the method can form gate electrode layers on the high-K dielectric layers. Step 1940 can include at least one of steps 1942 and 1944. At step 1942, the method can form the gate electrode layers on upper and lower surfaces of the high-K dielectric layers. At step 1944, the method can form gate electrode layers having an NMOS property. The method 1900 can then continue to step 1950. At step 1950, the method can form metallic source and drain electrode layers on sidewalls of the semiconductor device. Step 1950 can include step 1955. At step 1955, the method can form the source and drain electrodes respectively contacting the source and drain layers. The method 1900 can end at step 1950.

Figure 20:
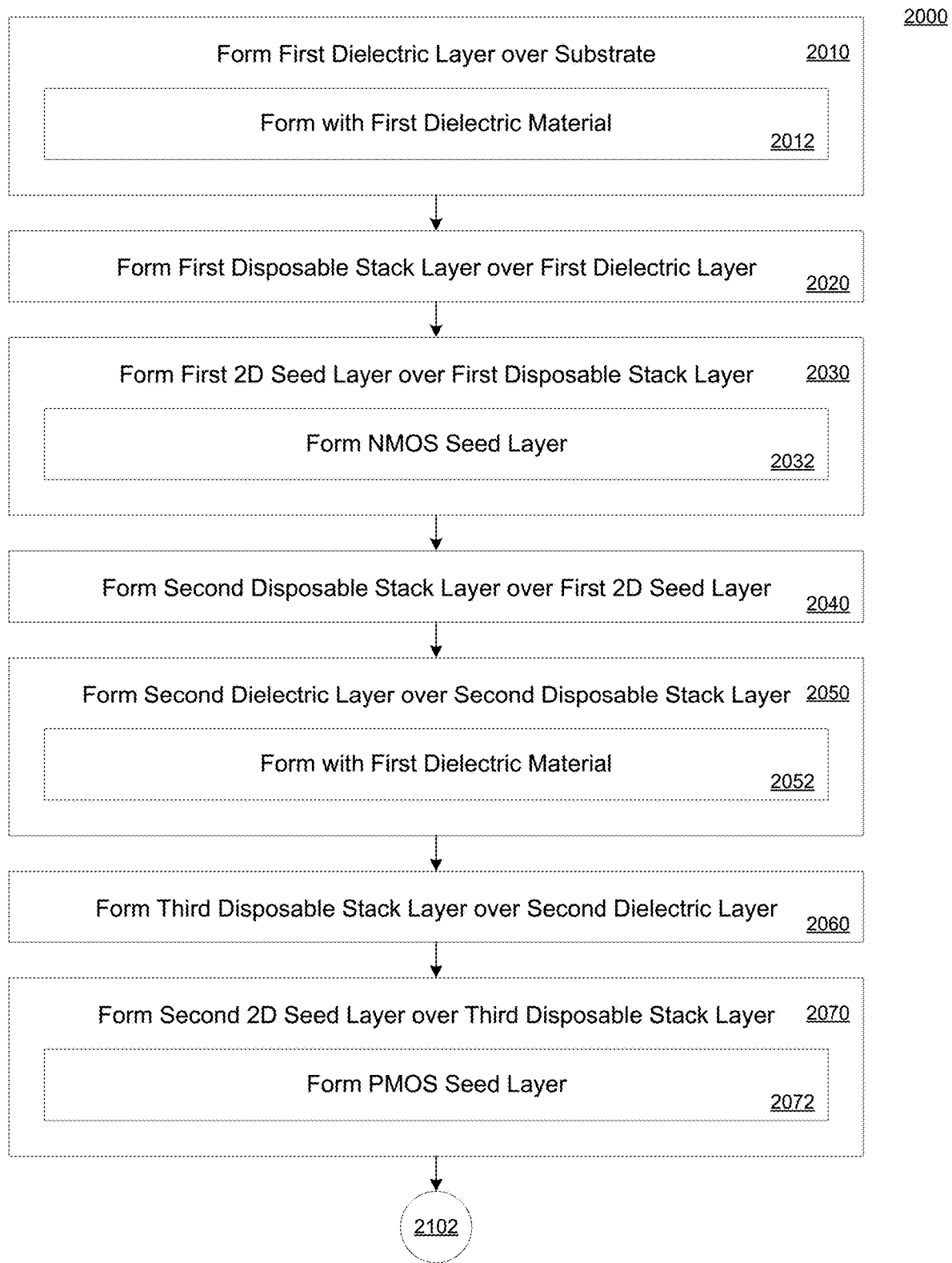
FIG. 20 illustrates a method of manufacturing a second semiconductor device, according to an embodiment.

FIG. 20 illustrates a method of manufacturing a second semiconductor device in accordance with present implementations. The method 2000 can manufacture one or more of the devices in states 800-1600 according to present implementations. The method 2000 can begin at step 2010.

At step 2010, the method can form a first dielectric layer over a substrate. Step 2010 can include step 2012. At step 2012, the method can form the first dielectric layer with a first dielectric material. The method 2000 can then continue to step 2020. At step 2020, the method can form a first disposable stack layer over the first dielectric layer. The method 2000 can then continue to step 2030. At step 2030, the method can form a first seed layer over the first disposable stack layer. Step 2030 can include step 2032. At step 2032, the method can form the first two-dimensional layer as an NMOS seed layer. The method 2000 can then continue to step 2040. At step 2040, the method can form a second disposable stack layer over the first seed layer. The method 2000 can then continue to step 2050. At step 2050, the method can form a second dielectric layer over the second disposable stack layer. Step 2050 can include step 2052. At step 2052, the method can form the first dielectric layer with the first dielectric material. The method 2000 can then continue to step 2060. At step 2060, the method can form third disposable stack layer over the second dielectric layer. The method 2000 can then continue to step 2070. At step 2070, the method can form a second seed layer over the third disposable stack layer. Step 2070 can include step 2072. At step 2072, the method can form the second seed layer as a PMOS seed layer. The method 2000 can then continue to step 2102.

Figure 21:
FIG. 21 illustrates a method of manufacturing a second semiconductor device further to the method of FIG. 20, according to an embodiment.

FIG. 21 illustrates a method of manufacturing a second semiconductor device further to the method of FIG. 20. The method 2100 can manufacture one or more of the devices in states 800-1600 according to present implementations. The method 2100 can begin at step 2102. The method 2100 can then continue to step 2110.

At step 2110, the method can form a fourth disposable stack layer over the second seed layer. The method 2100 can then continue to step 2120. At step 2120, the method can form a third dielectric layer over the fourth disposable stack layer. Step 2120 can include step 2122. At step 2122, the method can form the third dielectric layer with the first dielectric material. The method 2100 can then continue to step 2130.

At step 2130, the method can form first source and drain layers at the first seed layer. Step 2130 can include at least one of steps 2132 and 2134. At step 2132, the method can partially indent the semiconductor device by etching the first seed layer to remove edge portions of the first seed layer. At step 2134, the method can fill the edge portions with metal having an NMOS property. The method 2100 can then continue to step 2140.

At step 2140, the method can form second source and drain layers at the second seed layer. Step 2140 can include at least one of steps 2142 and 2144. At step 2142, the method can partially indent the semiconductor device by etching the second seed layer to remove edge portions of the second seed layer. At step 2144, the method can fill the edge portions with metal having a PMOS property. The method 2100 can then continue to step 2202.

Figure 22:
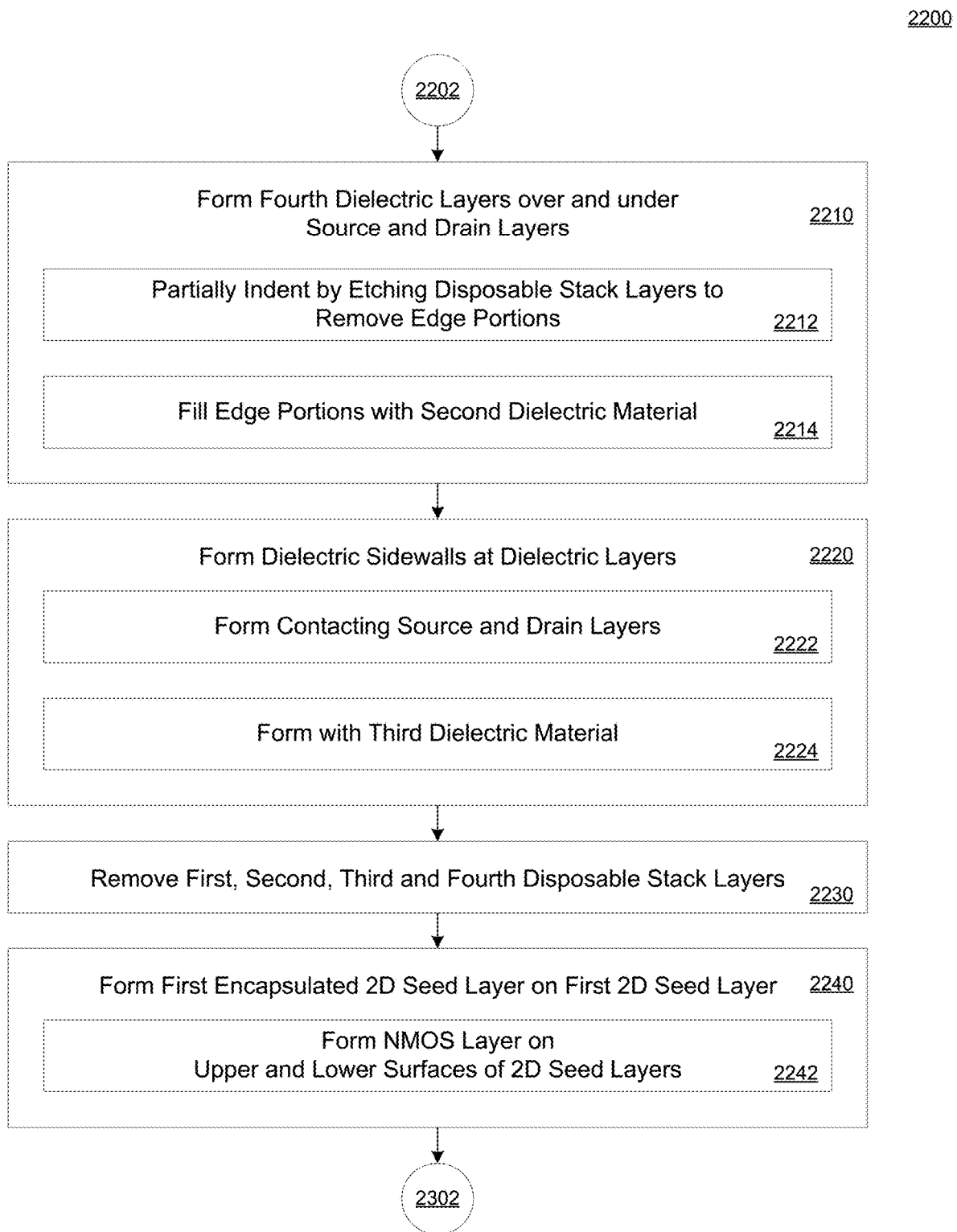
FIG. 22 illustrates a method of manufacturing a second semiconductor device further to the method of FIG. 21, according to an embodiment.

FIG. 22 illustrates a method of manufacturing a second semiconductor device further to the method of FIG. 21. The method 2200 can manufacture one or more of the devices in states 800-1600 according to present implementations. The method 2200 can begin at step 2202. The method 2200 can then continue to step 2210.

At step 2210, the method can form fourth dielectric layers over and under the source and drain layers. Step 2210 can include at least one of steps 2212 and 2214. At step 2212, the method can partially indent the semiconductor device by etching the disposable stack layers to remove edge portion of the disposable stack layers. At step 2214, the method can fill the edge portions with a second dielectric material. The method 2200 can then continue to step 2220. At step 2220, the method can form dielectric sidewalls at the dielectric layers. Step 2220 can include at least one of steps 2222 and 2224. At step 2222, the method can form dielectric sidewalls contacting the source and drain layers. At step 2224, the method can form the dielectric sidewalls with a third dielectric material. The method 2200 can then continue to step 2230. At step 2230, the method can remove the first, second, third, and fourth disposable stack layers. The method 2200 can then continue to step 2240. At step 2240, the method can form a first encapsulated seed layer on the first seed layer. Step 2240 can include step 2242. At step 2242, the method can form the first encapsulated layer having an NMOS property on upper and lower surfaces of the first seed layer. The method 2200 can then continue to step 2302.

Figure 23:
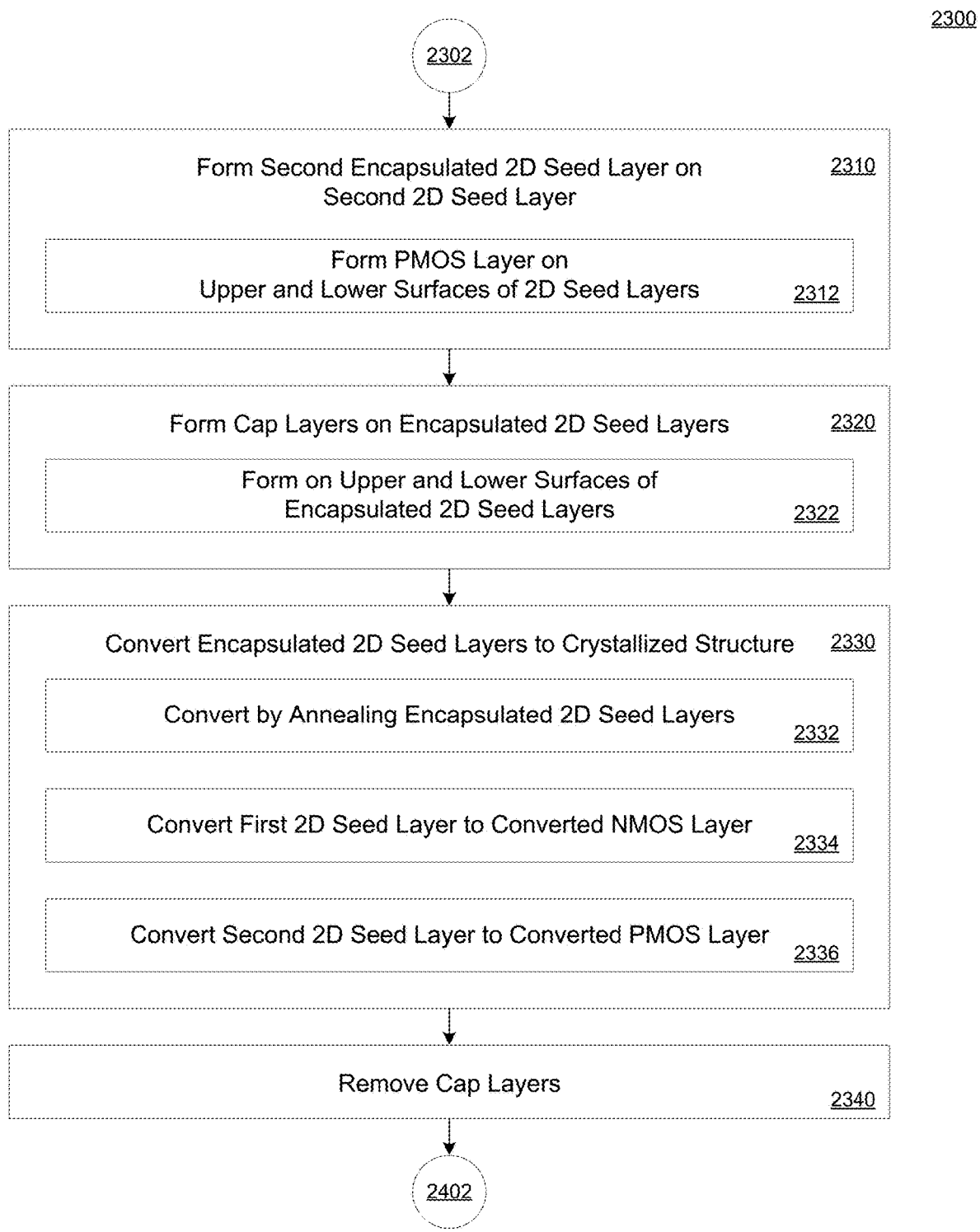
FIG. 23 illustrates a method of manufacturing a second semiconductor device further to the method of FIG. 22, according to an embodiment.

FIG. 23 illustrates a method of manufacturing a second semiconductor device further to the method of FIG. 22. The method 2300 can manufacture one or more of the devices in states 800-1600 according to present implementations. The method 2300 can begin at step 2302. The method 2300 can then continue to step 2310.

At step 2310, the method can form a second encapsulated seed layer on the second seed layer. Step 2310 can include step 2312. At step 2312, the method can form the first encapsulated layer having a PMOS property on upper and lower surfaces of the second seed layer. The method 2300 can then continue to step 2320. At step 2320, the method can form cap layers on the encapsulated seed layers. Step 2320 can include step 2322. At step 2322, the method can form the cap layers on upper and lower surfaces of the first and second encapsulated seed layers. The method 2300 can then continue to step 2330.

At step 2330, the method can convert the encapsulated seed layers to a crystallized structure. The conversion can include converting a flat or planar lattice structure of the layer to a three-dimensional crystalline structure Step 2330 can include at least one of steps 2332, 2334 and 2336. At step 2332, the method can convert the encapsulated seed layers by annealing the encapsulated seed layers. At step 2334, the method can convert the first seed layer to a converted NMOS layer. At step 2336, the method can convert the second seed layer to a converted PMOS layer. The method 2300 can then continue to step 2340. At step 2340, the method can remove the cap layers. The method 2300 can then continue to step 2402.

Figure 24:
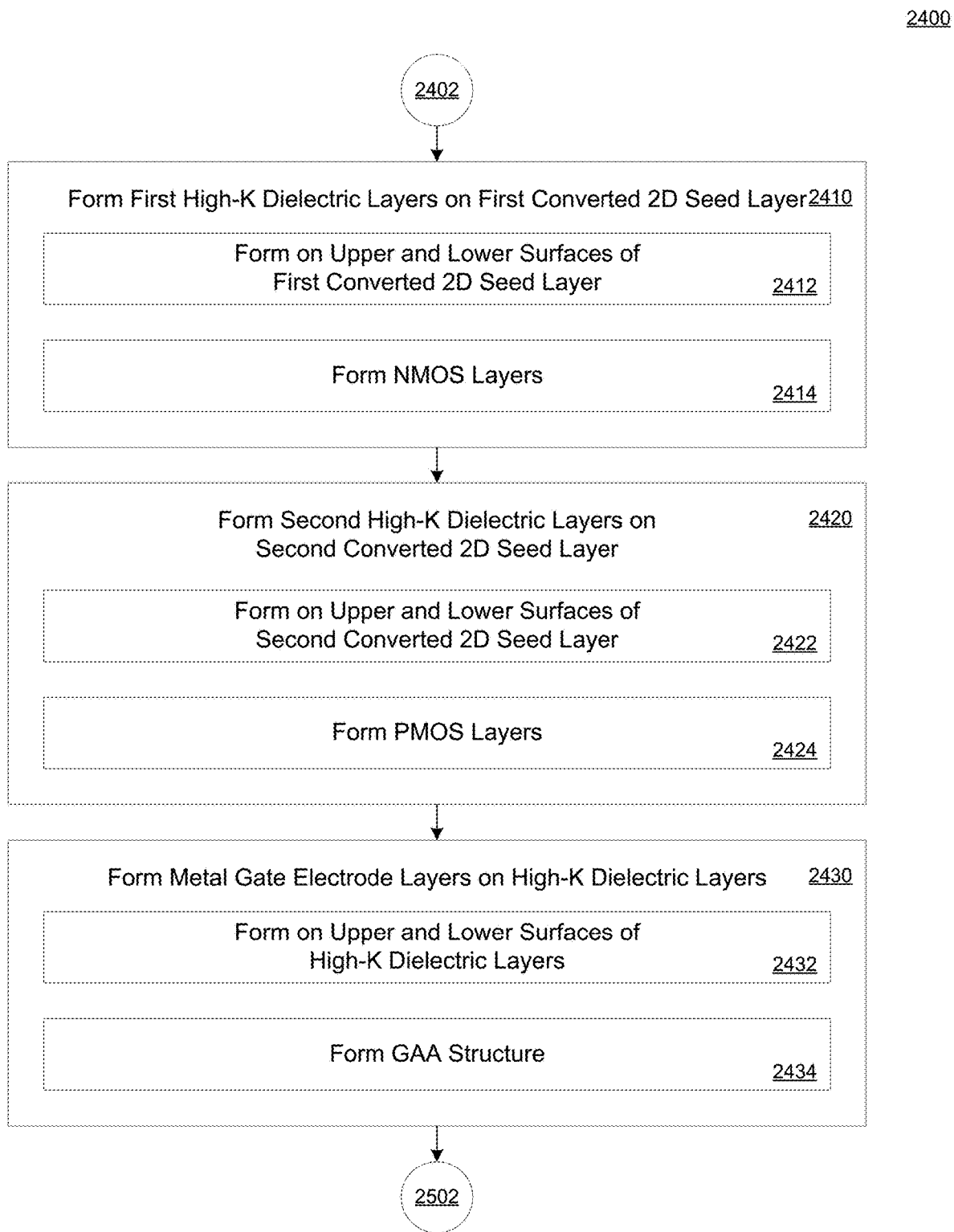
FIG. 24 illustrates a method of manufacturing a second semiconductor device further to the method of FIG. 23, according to an embodiment.

FIG. 24 illustrates a method of manufacturing a second semiconductor device further to the method of FIG. 23. The method 2400 can manufacture one or more of the devices in states 800-1600 according to present implementations. The method 2400 can begin at step 2402. The method 2400 can then continue to step 2410.

At step 2410, the method can form first high-K dielectric layers on the first converted seed layer. Step 2410 can include at least one of steps 2142 and 2414. At step 2412, the method can form the first high-K dielectric layers on upper and lower surfaces of the first converted seed layers. At step 2414, the method can form the first high-K dielectric layers having an NMOS property. The method 2400 can then continue to step 2420.

At step 2420, the method can form second high-K dielectric layers on the second converted seed layer. Step 2420 can include at least one of steps 2422 and 2424. At step 2422, the method can form the second high-K dielectric layers on upper and lower surfaces of the second converted seed layers. At step 2424, the method can form the second high-K dielectric layers having a PMOS property. The method 2400 can then continue to step 2430. At step 2430, the method can form metal gate electrode layers on the high-K dielectric layers. Step 2430 can include at least one of steps 2432 and 2434. At step 2432, the method can form the metal gate electrode layers on upper and lower surfaces of the high-K dielectric layers. At step 2434, the method can form a GAA structure. The method 2400 can then continue to step 2502.

FIG. 25 illustrates a method of manufacturing a second semiconductor device further to the method of FIG. 24. The method 2500 can manufacture one or more of the devices in states 800-1600 according to present implementations. The method 2500 can begin at step 2502. The method 2500 can then continue to step 2510.

At step 2510, the method can form first metallic source and drain electrode layers on sidewalls of the semiconductor device. Step 2510 can include at least one of steps 2512, 2514 and 2516. At step 2512, the method can partially indent the semiconductor device by etching the disposable stack layers to remove edge portions of the disposable stack layers. At step 2514, the method can fill the edge portions with metal having an NMOS property. At step 2516, the method can form the first source and drain electrodes respectively contacting the source and drain layers. The method 2500 can then continue to step 2520.

At step 2520, the method can form second metallic source and drain electrode layers on sidewalls of the semiconductor device. Step 2520 can include at least one of steps 2522, 2524 and 2526. At step 2522, the method can partially indent the semiconductor device by etching the disposable stack layers to remove edge portions of the disposable stack layers. At step 2524, the method can fill the edge portions with metal having a PMOS property. At step 2524, the method can form the second source and drain electrodes respectively contacting the source and drain layers. The method 2500 can end at step 2520.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A semiconductor device, comprising:
   a first metal contact;
   a second metal contact;
   a seed layer extending from the first metal contact to the second metal contact;
   a first terminal layer coupled between a first end of the seed layer and the first metal contact;
   a second terminal layer coupled between a second end of the seed layer and the second metal contact;
   a re-crystallized two-dimensional (2D) material wrapping around the seed layer, a portion of the first terminal layer, and a portion of the second terminal layer; and
   a gate structure wrapping around the re-crystallized 2D material.

2. The device of claim 1, wherein
   the first terminal layer includes a first terminal material and has a planar structure; and
   the second terminal layer includes the first terminal material and has the planar structure.

3. A CFET semiconductor device comprising:
   a first seed layer including a first material having a planar structure, the first material having a two-dimensional structure and one of a PMOS or NMOS property;
   a first terminal layer and a second terminal layer in contact with ends of the first seed layer, respectively;
   a first re-crystallized material wrapping around the first seed layer, a portion of the first terminal layer, and a portion of the second terminal layer;
   a second seed layer including a second material having the planar structure, the first second material having the two-dimensional structure and one of a PMOS or NMOS property different from the PMOS or NMOS property of the first seed layer;
   a third terminal layer and a fourth terminal layer in contact with ends of the second seed layer, respectively; and
   a second re-crystallized material wrapping around the second seed layer, a portion of the third terminal layer, and a portion of the fourth terminal layer.

4. The device of claim 3, wherein the first re-crystallized material is an NMOS material and the second re-crystallized material is a PMOS material.

5. The device of claim 3, further comprising:
   a first metal and a second metal coupled to ends of the first seed layer through the first terminal layer and the second terminal layer, respectively; and
   a third metal and a fourth metal coupled to ends of the second seed layer through the third terminal layer and the fourth terminal layer, respectively.

6. The device of claim 5, further comprising:
   a third seed layer including the first material and having the planar structure;
   a third re-crystallized material around the third seed layer;
   a fourth seed layer including a second material and having the planar structure; and
   a fourth re-crystallized material around the fourth seed layer.

7. The device of claim 6, wherein the first metal and the second metal are coupled to the third seed layer, and the third metal and the fourth metal are coupled to the fourth seed layer.

8. The device of claim 7, wherein the first seed layer and the third seed layer comprise a PMOS material.

9. The device of claim 7, wherein the second seed layer and the fourth seed layer comprise an NMOS material.

10. A semiconductor device, comprising:
    a first metal contact;
    a first terminal layer in contact with the first metal contact and including a terminal material;
    a second terminal layer disposed above the first terminal layer, in contact with the first metal contact, and including the terminal material;
    a second metal contact;
    a third terminal layer in contact with the second metal contact and including the terminal material;
    a fourth terminal layer disposed above the third terminal layer, in contact with the second metal contact, and including the terminal material;
    a first seed layer extending from the first terminal layer to the second terminal layer;
    a first re-crystallized two-dimensional (2D) material wrapping around the first seed layer, a portion of the first terminal layer, and a portion of the second terminal layer;
    a first gate structure wrapping around the first re-crystallized 2D material;
    a second seed layer extending from the third terminal layer to the fourth terminal layer;
    a second re-crystallized 2D material wrapping around the second seed layer, a portion of the third terminal layer, and a portion of the fourth terminal layer; and
    a second gate structure wrapping around the second re-crystallized 2D material.

11. The device of claim 10, wherein the first seed layer has one of a PMOS or NMOS property.

12. The device of claim 11, wherein the second seed layer has one of a PMOS or NMOS property different from the PMOS or NMOS property of the first seed layer.

* * * * *